United States Patent
Kazama et al.

(10) Patent No.: US 8,885,368 B2
(45) Date of Patent: Nov. 11, 2014

(54) POWER CONVERTING APPARATUS SUPPRESSING SWITCHING NOISE BY CONTROLLING SWITCHING OPERATION

(75) Inventors: Shun Kazama, Osaka (JP); Masaki Tagome, Osaka (JP); Makoto Kitabatake, Nara (JP)

(73) Assignee: Panasonic Corporation, Osaka (JP)

( * ) Notice: Subject to any disclaimer, the term of this patent is extended or adjusted under 35 U.S.C. 154(b) by 135 days.

(21) Appl. No.: 13/641,757

(22) PCT Filed: Jun. 17, 2011

(86) PCT No.: PCT/JP2011/003463
§ 371 (c)(1),
(2), (4) Date: Oct. 17, 2012

(87) PCT Pub. No.: WO2012/042706
PCT Pub. Date: Apr. 5, 2012

(65) Prior Publication Data
US 2013/0039100 A1    Feb. 14, 2013

(30) Foreign Application Priority Data

Sep. 29, 2010    (JP) ................................. 2010-218216

(51) Int. Cl.
| | | |
|---|---|---|
| *H02M 1/12* | (2006.01) | |
| *H02M 7/5387* | (2007.01) | |
| *H02M 7/497* | (2007.01) | |
| *H02M 1/15* | (2006.01) | |
| *H03K 17/16* | (2006.01) | |

(52) U.S. Cl.
CPC ............ *H03K 17/164* (2013.01); *H02M 7/5387* (2013.01); *H02M 7/497* (2013.01); *H02M 1/15* (2013.01)
USPC ................................ 363/41; 363/98; 363/132

(58) Field of Classification Search
CPC ....... H02M 7/48; H02M 7/497; H02M 7/501; H02M 2001/12
USPC .................... 363/39–41, 95, 97, 98, 131, 132
See application file for complete search history.

(56) References Cited

U.S. PATENT DOCUMENTS

| | | | |
|---|---|---|---|
| 5,359,278 | A | 10/1994 | Notohara et al. |
| 6,100,729 | A | 8/2000 | Nagano et al. |

(Continued)

FOREIGN PATENT DOCUMENTS

| | | |
|---|---|---|
| CN | 1674423 | 9/2005 |
| EP | 2 151 915 | 2/2010 |

(Continued)

OTHER PUBLICATIONS

International Search Report issued Sep. 20, 2011 in corresponding International Application No. PCT/JP2011/003463.

(Continued)

*Primary Examiner* — Gary L Laxton
*Assistant Examiner* — Kyle J Moody
(74) *Attorney, Agent, or Firm* — Wenderoth, Lind & Ponack, L.L.P.

(57) ABSTRACT

A power converter for effectively reducing switching noise is provided. The power converter comprises a capacitor 111; switching devices Q11*a* and Q11*b* connected to the capacitor 111 in parallel; and a controller 105 that controls each switching device individually to perform switching operations. Each of the switching devices Q11*a* and Q11*b* forms a closed circuit together with the capacitor 111. The controller 105 controls the switching devices Q11*a* and Q11*b* to perform switching operations of switching ON or OFF at different timings such that at least two closed circuits including the switching devices Q11*a* and Q11*b* mutually cancel ringing voltages occurring therein, each ringing voltage occurring due to the switching operations performed by a corresponding switching device and having a frequency defined by an inductance of a corresponding closed circuit and an output capacity of a switching device included in the corresponding closed circuit.

30 Claims, 24 Drawing Sheets

(56) References Cited

U.S. PATENT DOCUMENTS

| | | | |
|---|---|---|---|
| 8,587,279 B2* | 11/2013 | Wang et al. ................... 323/282 |
| 8,593,092 B2* | 11/2013 | Kuroda et al. ........... 318/400.11 |
| 8,619,448 B2* | 12/2013 | Ogawa et al. ................. 363/132 |
| 2002/0075702 A1 | 6/2002 | Igarashi et al. |
| 2005/0163237 A1 | 7/2005 | Katanaya |
| 2005/0212497 A1 | 9/2005 | Cha |
| 2006/0067093 A1* | 3/2006 | Tanaka et al. ................... 363/41 |
| 2006/0067655 A1 | 3/2006 | Okuda et al. |
| 2007/0279948 A1* | 12/2007 | Shin et al. ...................... 363/41 |
| 2008/0068865 A1* | 3/2008 | Kim et al. ...................... 363/17 |
| 2008/0089444 A1 | 4/2008 | Shin et al. |
| 2013/0154495 A1* | 6/2013 | He ............................... 315/210 |

FOREIGN PATENT DOCUMENTS

| | | |
|---|---|---|
| JP | 4-123520 | 4/1992 |
| JP | 6-152372 | 5/1994 |
| JP | 7-274517 | 10/1995 |
| JP | 7-327054 | 12/1995 |
| JP | 11-274901 | 10/1999 |
| JP | 2002-199699 | 7/2002 |
| JP | 2002-252985 | 9/2002 |
| JP | 2003-209973 | 7/2003 |
| JP | 2004-364443 | 12/2004 |
| JP | 2005-218170 | 8/2005 |
| JP | 2006-101675 | 4/2006 |
| JP | 2006-333647 | 12/2006 |
| JP | 2007-18617 | 1/2007 |
| JP | 2008-109727 | 5/2008 |
| JP | 2008-125341 | 5/2008 |

OTHER PUBLICATIONS

Office Action issued Mar. 5, 2014 in corresponding Chinese Application No. 201180021208.6 (with partial English translation).
Extended European Search Report issued Mar. 20, 2014 in corresponding European Application No. 11828276.3.

* cited by examiner

FIG. 14A  Embodiment 3
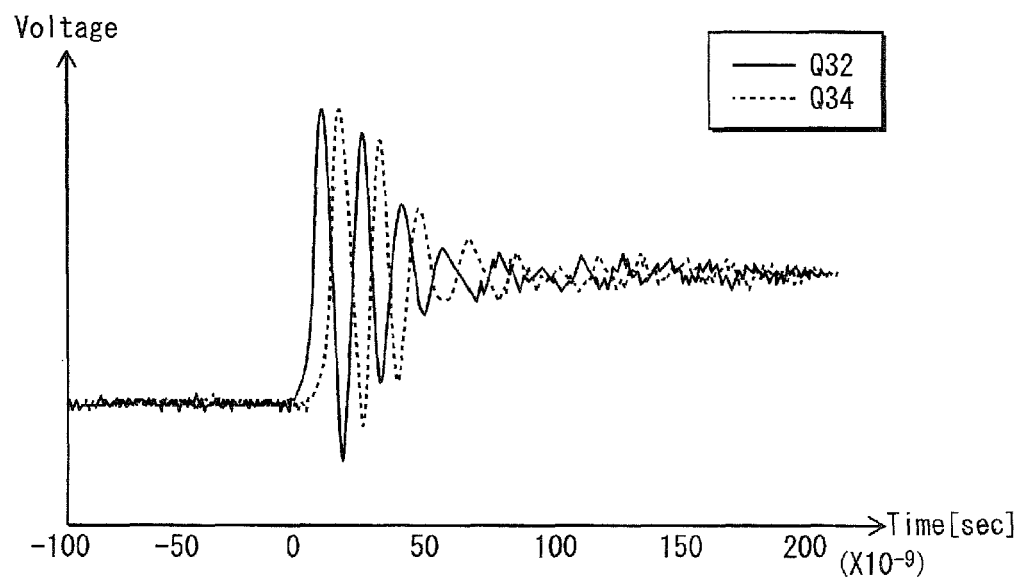
FIG. 14B  Comparative case
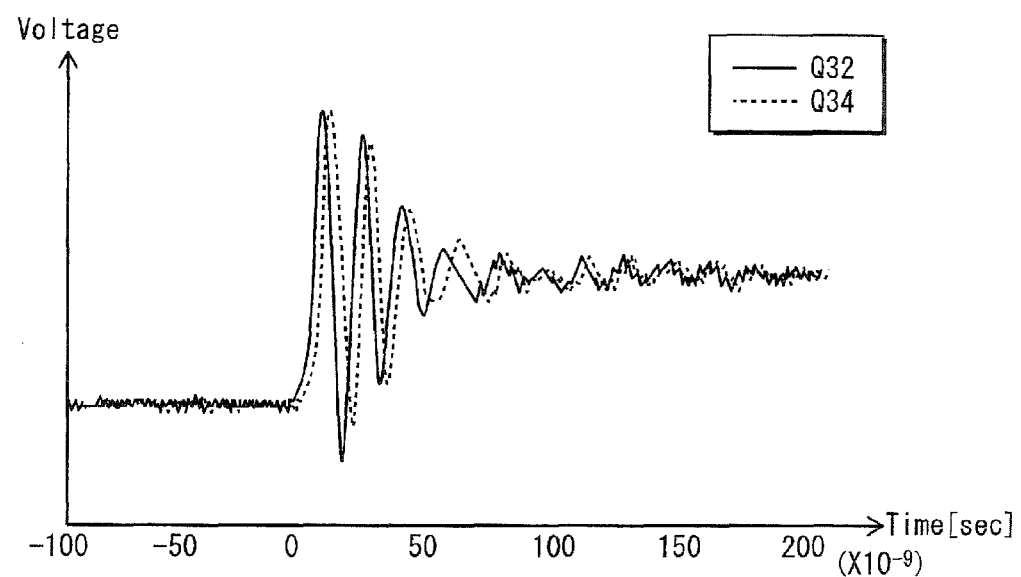

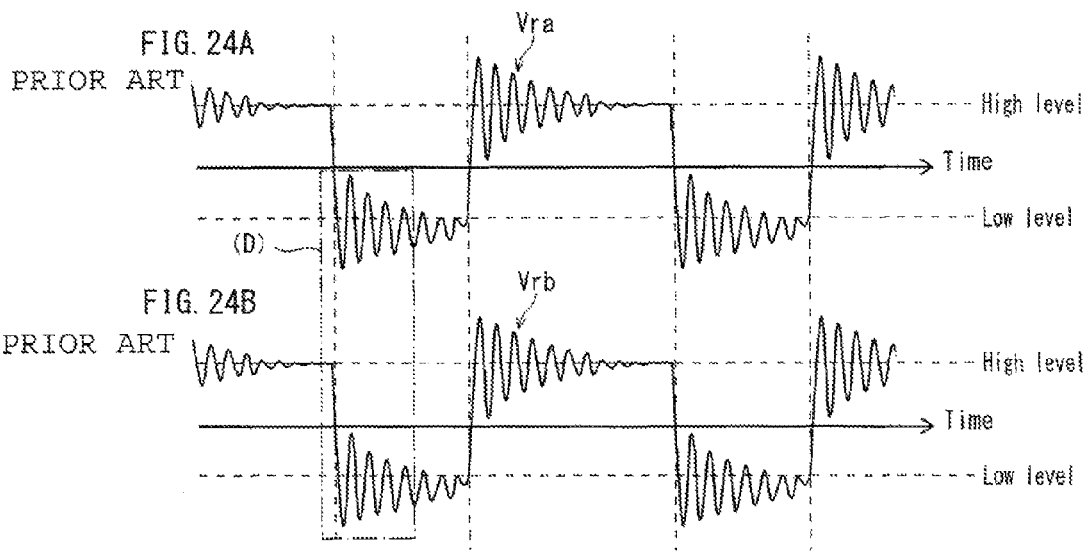
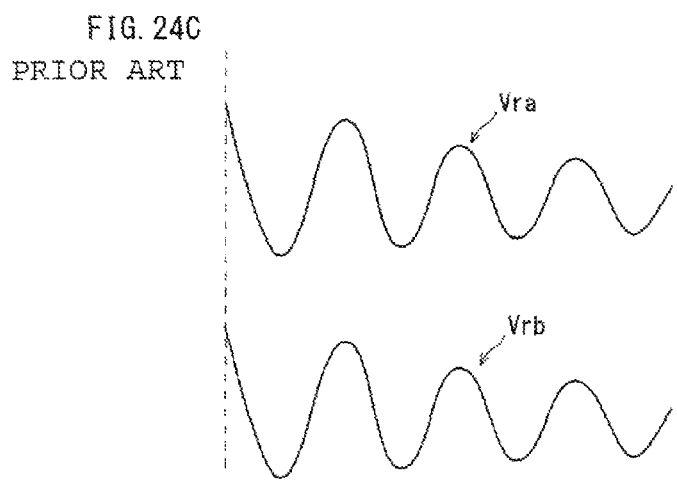

US 8,885,368 B2

POWER CONVERTING APPARATUS SUPPRESSING SWITCHING NOISE BY CONTROLLING SWITCHING OPERATION

TECHNICAL FIELD

The present invention relates to a technology for reducing noise of power converters represented by an inverter, a converter and the like.

BACKGROUND ART

Inverters and converters are known as power converters. Inverters convert direct current into alternating current and supply the alternating current to a load such as a motor. Converters convert alternating current supplied from an alternating current power source into direct current.

As an approach for obtaining a sine wave output voltage from a three-phase inverter, Pulse Width Modulation (PWM) control is generally used, for example. In the PWM control, switching operations are performed at a high speed by high-side switches and low-side switches connected in parallel in each of U-phase, V-phase, and W-phase arms. This contributes to generation of high-frequency switching noise of the three-phase inverter. Further, a load such as a motor has parasitic capacitance between the motor itself and a frame ground, and accordingly the high-frequency switching noise might flow through the motor via the parasitic capacitance and cause damage to a bearing of the motor and malfunction of the accessories. So as to solve such a problem, various technologies for reducing noise have been disclosed (e.g., Patent Literature 1).

Meanwhile, in recent years, power converters represented by inverters and converters have been required to be large in capacity. However, the ampacity of a switching device used therein is limited. In consideration of this issue, as shown in FIG. 23, there has been a technology for using a plurality of switching devices connected in parallel.

FIG. 23 shows an overall structure of a load drive system 900 provided with a power converter pertaining to conventional art.

The load drive system 900 converts direct current supplied from a direct current power source DC into the three-phase alternating current by using a three-phase inverter 902, and supplies the three-phase alternating current to a motor 904. The operations of the three-phase inverter 902 are controlled by PWM signals Pu, Pv, and Pw that are output from a controller 905.

The three-phase inverter 902 constitutes a three-phase bridge, and is composed of a U-phase arm 912u, a V-phase arm 912v and a W-phase arm 912w. The U-phase arm 912u is composed of a high-side switching device group Q91 and a low-side switching device group Q92 connected in parallel. The high-side switching device group Q91 is composed of switching devices Q91a and Q91b connected in parallel. In a similar manner, a low-side switching device group Q92 is composed of switching devices Q92a and Q92b connected in parallel.

A gate terminal of each of the switching devices Q91a, Q91b, Q92a and Q92b is connected to a gate drive circuit GD. The switching devices connected in parallel such as the switching devices Q91a and Q91b are supplied with the same PWM signal Pu from the controller 905 via their respective corresponding gate drive circuits GDs. As a result, the switching devices Q91a and Q91b operate synchronously with each other. Note that although reference signs are not particularly provided in FIG. 23, the V-phase arm 912v and the W-phase arm 912w have the same structure as the U-phase arm 912u.

According to the above structure, the switching device group can increase an amount of current to be flowed, compared with a case in which one switching device group is composed of only one switching device. Even when one switching device group is desired to flow a predetermined amount of current, no single switching device can send the predetermined amount of current. In such a case, it is possible to satisfy the above desire by using the above technology, that is, by forming one switching device group by connecting in parallel two switching devices each of which can flow approximately a half of the above predetermined amount of current.

CITATION LIST

Patent Literature

[Patent Literature 1]
  Japanese patent application publication No. 2006-333647
[Patent Literature 2]
  Japanese patent application publication No. H7-274517

SUMMARY OF INVENTION

Technical Problem

The inventors of the present invention, however, have found that with the structure shown in FIG. 23, switching noise generated by the three-phase inverter 902 increases. Details of the problem are described with reference to FIGS. 24A-24C.

FIGS. 24A-24C show a timing chart of switching operations pertaining to conventional art. FIGS. 24A-24C only show the operations of the high-side switching device group Q91 shown in FIG. 23. FIG. 24A shows the voltage change between terminals of the switching device Q91a. FIG. 24B shows the voltage change between terminals of the switching device Q91b. FIG. 24C is an enlarged view of a part (D).

As shown in FIGS. 24A and 24B, when the switching devices Q91a and Q91b switch ON/OFF, the voltage between terminals of each switching device transitions between high level and low level accordingly. The voltage, however, does not simply switches between high level and low level, and ringing voltages indicated by Vra and Vrb respectively occur between the terminals of the switching devices Q91a and Q91b at the same time as the state transition. Such a ringing voltage occurs due to resonance caused by a parasitic inductance component L and a parasitic capacitance component C generated in circuits constituting the three-phase inverter. After careful examination, the inventors of the present invention have found that the ringing voltages are one of the causes of switching noise.

According to the structure shown in FIG. 23, the switching devices Q91a and Q91b operate synchronously with each other, and therefore the ringing voltages Vra and Vrb occurring between the terminals of the switching devices Q91a and Q91b naturally have the same phase as shown in FIG. 24C. This means that ringing voltages are superimposed and accordingly switching noise increases.

The present invention has been achieved in view of the above problem, and an aim thereof is to provide a power converter that can efficiently reduce switching noise.

Solution to Problem

In order to achieve the above aim, the power converter pertaining to the present invention is a power converter comprising: a capacitor; a plurality of switching devices connected to the capacitor in parallel; and a controller configured to control each switching device individually to perform switching operations, wherein each switching device forms a closed circuit together with the capacitor, and the controller controls, for at least two closed circuits, switching devices included therein to perform switching operations of switching ON or OFF at different timings such that the at least two closed circuits mutually cancel ringing voltages occurring therein, each ringing voltage occurring due to the switching operations performed by a corresponding switching device and having a frequency defined by an inductance of a corresponding closed circuit and an output capacity of a switching device included in the corresponding closed circuit.

Advantageous Effects of Invention

According to the structure of the power converter pertaining to the present invention, ringing voltages occurring due to switching operations in at least two closed circuits each including a capacitor and switching devices are cancelled out between the at least two closed circuits. Here, the meaning of the expression "the ringing voltages are cancelled out" includes not only the case where the ringing voltages are completely cancelled out but also the case where the ringing voltages are partly cancelled out. Even when the ringing voltages are partly cancelled out, it is possible to reduce switching noise compared to conventional art.

On the other hand, as disclosed by Patent Literature 1, there is an approach for reducing switching noise by adding a noise cancelling circuit to the power converter. However, this approach can only prevent switching noise caused by switching operations from conducting from the closed circuit to the current power source, and cannot reduce switching noise itself within the closed circuits. Accordingly, there is a problem that although this approach is effective against conductive noise conducting to the current power source via parasitic capacitance, wires and the like that are included in circuits constituting the system, it is ineffective against radiation noise radiated to the space.

However, unlike Patent Literature 1, the power converter pertaining to the present invention with the above structure can reduce switching noise within the closed circuits that generate the switching noise. As a result, it is possible to obtain the effect of reducing not only conductive noise conducting to the current power source via the parasitic capacitance, wires and the like within the power converter but also radiation noise radiated to the space outside the power converter.

Thus, the power converter that effectively reduces switching noise can be provided.

BRIEF DESCRIPTION OF DRAWINGS

FIG. 14A shows a waveform and a phase of a ringing voltage pertaining to Embodiment 3. FIG. 14B shows a waveform and a phase of a ringing voltage pertaining to a comparative case.

FIGS. 24A-24C show a timing chart pertaining to conventional art.

DESCRIPTION OF EMBODIMENTS

Embodiments of the present invention are described below with reference to the drawings.

[Embodiment 1]

<Structure>

Figure 1:
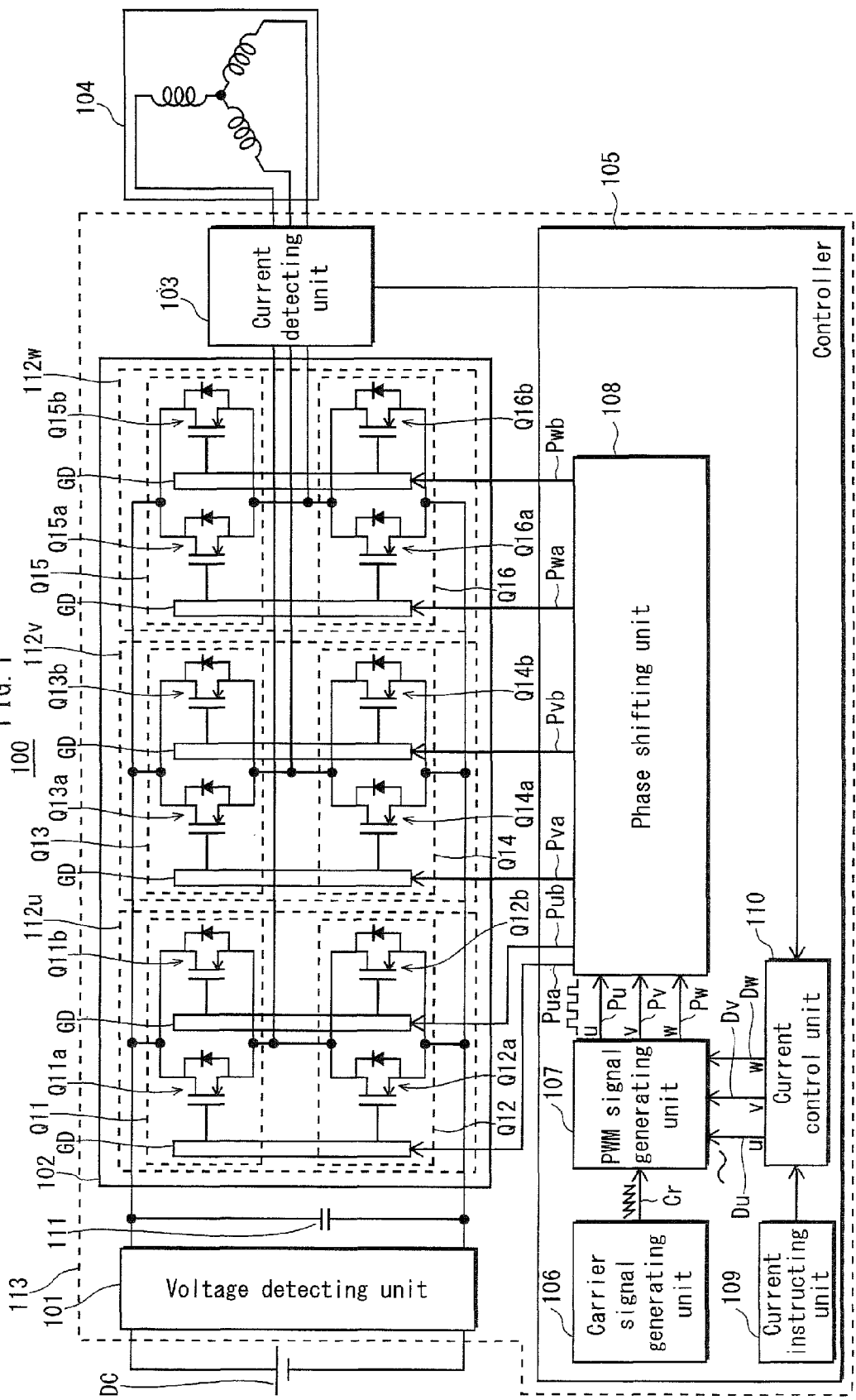
FIG. 1 shows an overall structure of a load drive system 100 provided with a power converter pertaining to Embodiment 1.

FIG. 1 shows an overall structure of a load drive system 100 provided with a power converter pertaining to Embodiment 1. The present embodiment describes the structure in which a three-phase alternating motor (hereinafter, referred to as motor) is a load.

The load drive system 100 includes a direct current power source DC, a power converter 113, and a motor 104.

The direct current power source DC is a direct current power source that obtains direct current by rectifying current from a commercial current power source, or a battery type direct current power source (represented by rechargeable nickel metal hydride battery, rechargeable lithium-ion battery and the like).

The power converter 113 includes a voltage detecting unit 101, a current detecting unit 103, a three-phase inverter 102, and a controller 105. The power converter 113 converts direct current supplied from the direct current power source DC into three-phase alternating current and supplies the three-phase alternating current to the motor 104. The three-phase alternating current is composed of U-phase, V-phase and W-phase that are out of phase by 120° (i.e., by $2\pi/3$ radians in electrical angle) with respect to one another. The three-phase alternating current is supplied to the motor 104.

The motor 104 is a three-phase alternating motor composed of a three-phase coil receiving the three-phase alternating current.

<Power Converter 113>

(Voltage Detecting Unit 101, Current Detecting Unit 103, Capacitor 111)

The voltage detecting unit 101 detects the voltage of direct current power source DC, i.e., the voltage input to the three-phase inverter 102.

The current detecting unit 103 detects the current input to the motor 104, i.e., the current output from the three-phase inverter 102.

The capacitor (smoothing capacitor) 111 is provided to reduce the voltage change within the power converter 113.

(Three-Phase Inverter 102)

The three-phase inverter 102 constitutes a three-phase bridge, and is composed of a U-phase arm 112$u$, a V-phase arm 112$v$ and a W-phase arm 112$w$. The structure of the arm of each phase is the same as that of the three-phase inverter 902 shown in FIG. 23, and accordingly the explanation thereof is omitted. Further, switching devices connected in parallel such as the switching devices Q11$a$ and Q11$b$ are the same in specifications such as withstand voltage and ampacity.

For the switching devices Q11$a$-Q16$a$ and Q11$b$-Q16$b$, power semiconductor devices represented by an Insulated Gate Bipolar Transistor (hereinafter, referred to as IGBT) and a Metal-Oxide-Semiconductor Field Effect Transistor (hereinafter, referred to as MOSFET) are employed. Between a collector and an emitter (or a drain and a source) of each of the switching devices Q11$a$, Q11$b$, Q12$a$ and Q12$b$, a diode for flowing current from the emitter (source) to the collector (drain) is connected. Note that when a MOSFET is used as a switching device, a parasitic diode may be used as a diode.

Here, the power converter 113 has, for each switching device, a closed circuit including one of the switching devices Q11$a$-Q16$a$ and Q11$b$-Q16$b$ and the capacitor 111. For example, one closed circuit includes the switching device Q11$a$ and the capacitor 111. The number of such closed circuits in the power converter 113 equals the number of switching devices (12).

(Controller 105)

The controller 105 individually controls switching operations of the switching devices Q11$a$-Q16$a$ and Q11$b$-Q16$b$ included in the three-phase inverter 102.

To be specific, the controller 105 generates pulse width modulation signals (hereinafter, referred to as PWM signals) that are instruction signals output to gate drive circuits GDs. These PWM signals are output to gate terminals of the switching devices Q11$a$-Q16$a$ and Q11$b$-Q16$b$ via the gate drive circuits GDs so as to individually control the above switching devices.

The controller 105 is specifically composed of a carrier signal generating unit 106, a PWM signal generating unit 107, a phase shifting unit 108, a current instructing unit 109, and a current control unit 110.

The carrier signal generating unit 106 generates a carrier signal Cr and outputs the generated carrier signal Cr to the PWM signal generating unit 107. The carrier signal Cr is voltage of sawtooth wave (e.g., a waveform formed by repeated cycles of voltage increasing gradually from a first level to reach a second level, and then resetting to the first level) with a frequency of some tens kHz.

The current instructing unit 109 outputs a current instruction for controlling the motor 104. A value of the current instruction is set in accordance with operations of the targeted motor 104. Such an instruction includes information on amplitude and frequency of a control instruction signal that is to be generated by the current control unit 110.

The current control unit 110 generates a sine wave control instruction signal based on the control instruction from the current instructing unit 109. When the actual operations of the motor 104 do not fit the targeted operations of the motor 104, the current control unit 110 receives a feedback signal from the current detecting unit 103 to correct the above control instruction signal to an appropriate sine wave, and outputs the corrected signal to the PWM signal generating unit 107. In FIG. 1, Du indicates a U-phase control instruction signal, Dv indicates a V-phase control instruction signal, and Dw indicates a W-phase control instruction signal. As described above, the current instructing unit 109 and the current control unit 110 constitute a control instruction signal generating unit.

The PWM signal generating unit 107 compares the input carrier signal Cr and the U-phase control instruction signal Du, and generates a PWM signal as a result of the comparison. The PWM signal Pu is output to the phase shifting unit 108. At the same time, the PWM signal generating unit 107 compares the carrier signal Cr with the V-phase control instruction signal Dv, and compares the carrier signal Cr with the W-phase control instruction signal Dw so as to generate PWM signals Pv and Pw as results of the comparison. The PWM signals Pv and Pw are output to the phase shifting unit 108.

The phase shifting unit 108 generates a PWM signal for each switching device based on the input PWM signals Pu, Pv and Pw, and outputs the generated PWM signal to a corresponding gate drive circuit GD. Detailed explanation is provided by using the high-side switching device group Q11. The phase shifting unit 108 generates a PWM signal Pua by shifting the PWM signal Pu by the first phase angle, and generates a PWM signal Pub by shifting the PWM signal Pu by the second phase angle. The second phase angle is delayed by a predetermined phase difference with respect to the first phase angle. The PWM signal Pua is output as a PWM signal for the switching device Q11$a$. The PWM signal Pub is output as a PWM signal for the switching device Q11$b$. The phase shifting unit 108 changes only a phase difference between the PWM signals Pua and Pub. In other switching device groups, the phase shifting unit 108 also performs the same phase shift on a PWM signal that is output to switching devices connected in parallel (for example, Q14$a$ and Q14$b$).

Figure 2:
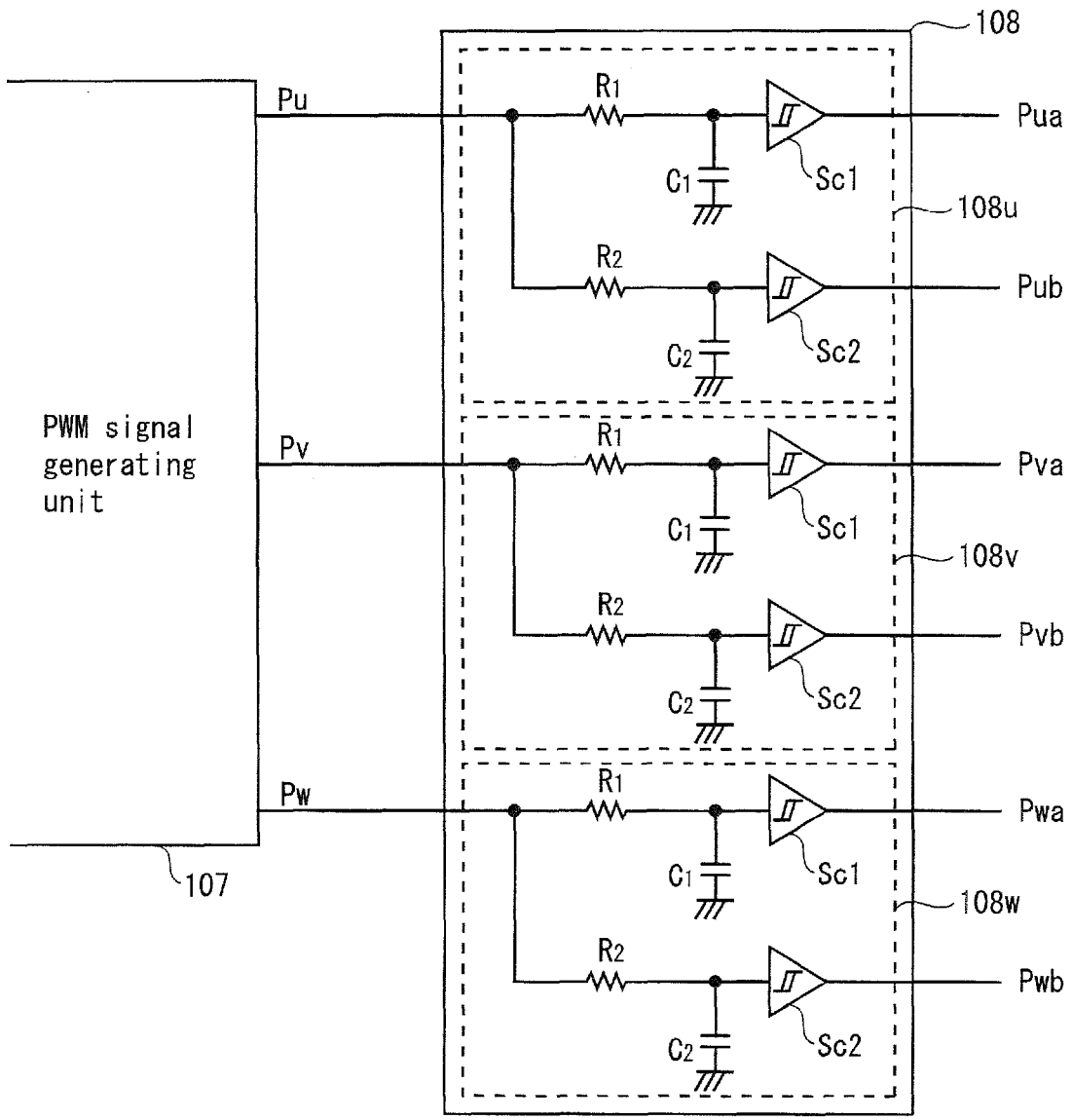
FIG. 2 is a circuit diagram showing an example of the structure of a phase shifting unit 108 pertaining to Embodiment 1.

FIG. 2 is a circuit diagram showing an example of the structure of a phase shifting unit 108. FIG. 2 shows only the PWM signal generating unit 107 and the phase shifting unit 108.

The U-phase shifting unit 108$u$ is composed of resistances R1 and R2, capacitors C1 and C2, and schmitt triggers Sc1 and Sc2. The above first phase angle is determined by multiplying R1 by C1, and the above second phase angle is determined by multiplying R2 by C2. By setting the product of R1 and C1 to be smaller than the product of R2 and C2, the PWM signal Pub, which is delayed by the predetermined phase difference with respect to the PWM signal Pua that is output from the schmitt trigger Sc1, is generated. The V-phase shifting unit 108*v* and the W-phase shifting unit 108*w* have the same structures as that of the U-phase shifting unit 108*u*, and accordingly the explanation thereof is omitted.

As described above, by providing the predetermined phase difference between the PWM signal Pua for the switching device Q11*a* and the PWM signal Pub for the switching device Q11*b*, it is possible to control the switching devices Q11*a* and Q11*b* to perform the switching operations at different timings. The amount of shift of the switching operations in this case is set such that a ringing voltage occurring between the terminals of the switching device Q11*a* and a ringing voltage occurring between the terminals of the switching device Q11*b* are cancelled out. The method of setting the amount of shift and its effect are specifically described in the next section.

<Principle of Reduction of Switching Noise>

The principle of reduction of switching noise is described with reference to FIGS. 3A-3F. FIGS. 3A-3F are a timing chart pertaining to Embodiment 1. Here, only the high-side switching device group Q11 in the U-phase arm 112*u* is explained.

FIG. 3A shows voltage waveforms of the carrier signal Cr of a sawtooth wave and the U-phase control instruction signal Du that are input to the PWM signal generating unit 107. The U-phase control instruction signal Du is a sine wave. FIG. 3A shows the enlarged U-phase control instruction signal Du in a very short time, assuming that the voltage hardly changes.

FIG. 3B shows a voltage waveform of the PWM signal Pua output from the phase shifting unit 108. FIG. 3C shows a voltage waveform of the PWM signal Pub output from the phase shifting unit 108. As shown in FIGS. 3A and 3B, the PWM signal Pub is delayed by α sec with respect to the PWM signal Pua, and a corresponds with the above-mentioned predetermined phase difference. In FIG. 2, by setting R1, R2, C1 and C2 such that the first phase angle (the product of R1 and C1) is negligible and the second phase angle (the product of R2 and C2) corresponds with a, the above structure can be realized.

FIG. 3D shows the voltage change between terminals of the switching device Q11*a*, and FIG. 3E shows the voltage change between terminals of the switching device Q11*b*. FIG. 3F is an enlarged view in the vicinity of an area (A) shown in FIGS. 3D and 3E.

In the PWM signal generating unit 107, a magnitude relation between the carrier signal Cr and the U-phase control instruction signal Du is reversed (FIG. 3A). Accordingly, the voltage waveform of the PWM signal Pua shown in FIG. 3B transitions from the OFF state to the ON state, or from the ON state to the OFF state. In the following explanation, it is assumed that when the U-phase control instruction signal Du becomes greater than the carrier signal Cr, the PWM signal Pua transitions from the ON state to the OFF state.

First, description is made on time (1) shown in FIGS. 3A-3F. In FIG. 3A, when the carrier signal Cr and the U-phase control instruction signal Du intersect, the PWM signal Pua shown in FIG. 3B transitions from the ON state to the OFF state. In accordance with the transition, the switching device Q11*a* switches from the ON state to the OFF state, and the voltage between the terminals of the switching device Q11*a* transitions from high level to low level (FIG. 3D). In this case, the switching device Q11*a* exhibits a great current change in a short time. As a result, as shown in FIG. 3D, a ringing voltage Vra, which is the high frequency oscillation, occurs between the terminals of the switching device Q11*a*. As described in Technical Problem, the ringing voltage occurring at the switching device is one of the causes of switching noise. Accordingly, reducing the ringing voltage can reduce switching noise.

Such a ringing voltage occurs due to resonance caused by a parasitic inductance component L and a parasitic capacitance component C generated in circuits constituting the three-phase inverter. Generally, frequency f of a ringing voltage is determined based on Math 1.

$$f = \frac{1}{2\pi\sqrt{LC}} \quad \text{[Math 1]}$$

Next, description is made on time (2) shown in FIGS. 3A-3F. The PWM signal Pub shown in FIG. 3C transitions from the ON state to the OFF state after a delay of α sec from the time (1). In accordance with the transition, the switching device Q11*b* switches from the ON state to the OFF state, and the voltage between the terminals of the switching device Q11*b* transitions from high level to low level (FIG. 3E). At this time, in a similar manner to the switching device Q11*a*, the switching device Q11*b* also experiences great current change in a short time. As a result, as shown in FIG. 3E, a ringing voltage Vrb, which is the high frequency oscillation, occurs between the terminals of the switching device Q11*b*.

Here, as described in the explanation of the three-phase inverter 102, the switching devices Q11*a* and Q11*b* are composed of switching devices that are the same in specifications such as withstand voltage and ampacity. Accordingly, a parasitic inductance component L and a parasitic capacitance component C generated in the switching device Q11*b* are the same as those of the switching device Q11*a*. That is, a value of frequency $f_r$ of the ringing voltage Vra occurring between the terminals of the switching device Q11*a* is the same as a value of frequency $f_r$ of the ringing voltage Vrb occurring between the terminals of the switching device Q11*b*.

Supposing an inverse of the frequency $f_r$ of the ringing voltage Vra is the period of one cycle of the ringing voltage Vra, the phase difference a corresponds with the period of a half of the cycle of the ringing voltage Vra. The phase difference a is defined by Math 2 with use of the frequency $f_r$ of the ringing voltage Vra. Note that the frequency $f_r$ of the ringing voltage Vra is roughly defined by inductance of a closed circuit including the switching device Q11*a* and the capacitor 111 (closed circuit that generates the ringing voltage Vra) and output capacity of the switching device Q11*a* included in the closed circuit. A method for calculating the frequency $f_r$ of the ringing voltage Vra is described later in details.

$$\alpha = \left(\frac{1}{f_r}\right) \times \left(\frac{180}{360}\right) \quad \text{[Math 2]}$$

Accordingly, as shown in FIG. 3F, a phase of the ringing voltage Vra is inverted with respect to a phase of the ringing voltage Vrb. According to this, the ringing voltages Vra and Vrb, which occur in accordance with the switching operations of the switching devices Q11*a* and Q11*b* for switching from the ON state to the OFF state, are cancelled out. As a result, switching noise generated by these switching devices can be reduced.

Next, description is made on time (3). In FIG. 3A, the carrier signal Cr and the U-phase control instruction signal Du intersect, and the PWM signal Pua shown in FIG. 3B transitions from the OFF state to the ON state. In accordance with the transition, the switching device Q11a switches from the OFF state to the ON state, and the voltage between the terminals of the switching device Q11a transitions from low level to high level (FIG. 3D). At this time as well, like the time (1), the ringing voltage Vra occurs between the terminals of the switching device Q11a.

Next, at time (4), the PWM signal Pub shown in FIG. 3C transitions from the OFF state to the ON state after a delay of α sec from the time (3). In accordance with the transition, the switching device Q11b switches from the OFF state to the ON state, and the voltage between the terminals of the switching device Q11b transitions from low level to high level (FIG. 3E). At this time as well, like the time (4), the ringing voltage Vrb occurs between the terminals of the switching device Q11b.

Accordingly, the ringing voltages Vra and Vrb, which occur in accordance with the switching operations of the switching devices Q11a and Q11b from the OFF state to the ON state, are cancelled out. As a result, switching noise generated by these switching devices can be reduced.

As described above, according to the above structure, it is possible to cancel both the ringing voltages occurring in accordance with transition of switching devices from the ON state to the OFF state and the ringing voltages occurring in accordance with transition of switching devices from the OFF state to the ON state.

<Method for Calculating Frequency $f_r$>

Figure 4:
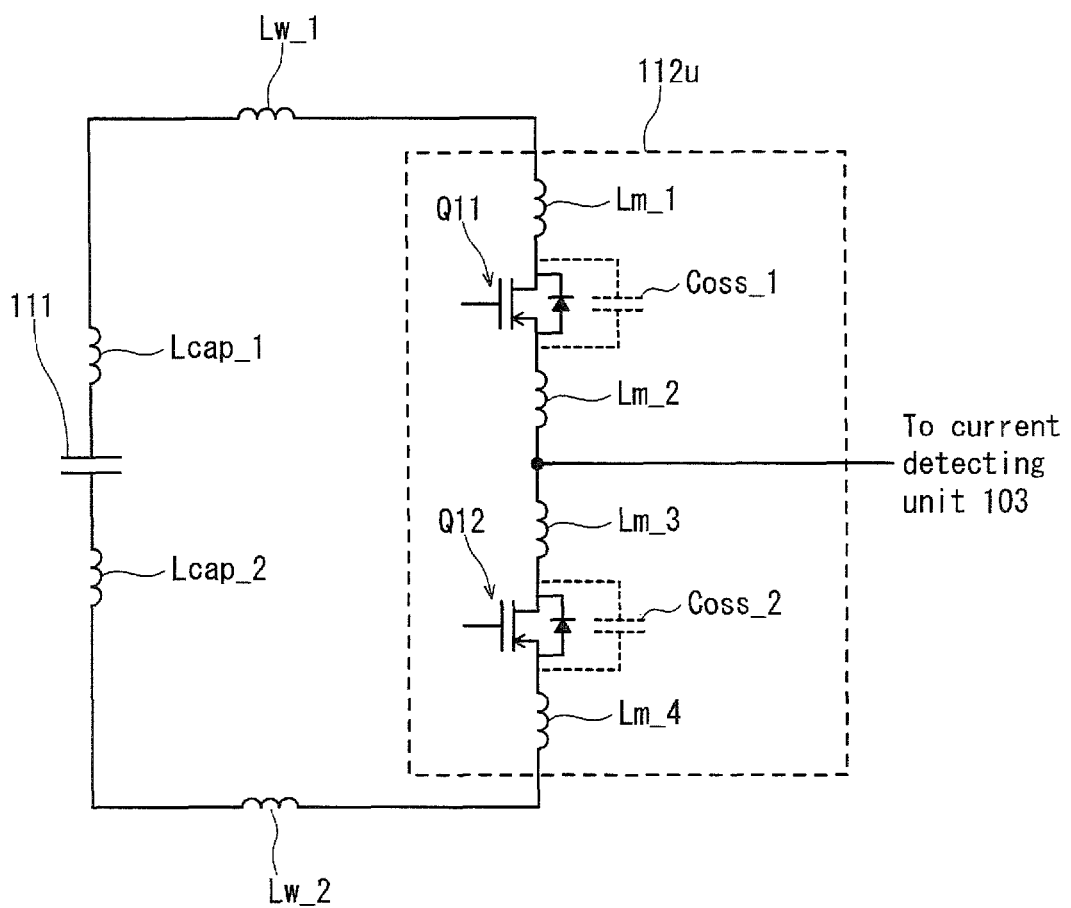
FIG. 4 shows an equivalency circuit model for calculating a frequency $f_r$.

Description is made on a method for calculating the frequency $f_r$ with reference to FIG. 4.

FIG. 4 shows an equivalency circuit model for calculating the frequency $f_r$. FIG. 4 only shows the U-phase arm 112u, and the capacitor 111 that are shown in FIG. 1. Here, as shown in FIG. 1, the switching devices Q11a and Q11b are connected in parallel, and the switching devices Q12a and Q12b are connected in parallel in the U-phase arm 112u. Accordingly, the amperage flowing through the switching device Q11a and the amperage flowing through the switching device Q11b is approximately the same, and the amperage flowing through the switching device Q12a and the amperage flowing through the switching device Q12b is also approximately the same. It is therefore assumed that in FIG. 4, the U-phase arm 112u includes only the switching device Q11a and the switching device Q12a for simplicity's sake. FIG. 4 shows a closed circuit including the switching device Q11a (or the switching device Q11b) and the capacitor 111, and a closed circuit including the switching device Q12a (or the switching device Q12b) and the capacitor 111.

In FIG. 4, the capacitor 111 is set to have enough capacity to supply energy for switching, and can be considered as an ideal voltage source. The capacitor 111, however, has parasitic inductance components caused by a wire connecting the capacitor 111 and other components, for example. Such inductances are defined as Lcap_1 and Lcap_2.

In the U-phase arm 112u, output capacity of the switching device Q11 (switching device Q11a) is defined as Coss_1, and inductances of a wire included in the switching device Q11 are defined as Lm_1 and Lm_2. On the other hand, output capacity of the switching device Q12 (switching device Q12a) is defined as Coss_2, and inductances of a wire connecting the switching device Q12 and other components are defined as Lm_3 and Lm_4.

Inductances of a wire connecting the capacitor 111 and the U-phase arm 112u are defined as Lw_1 and Lw_2.

Here, in the closed circuit including the switching device Q11a (switching device Q11) and the capacitor 111, inductances of a wire included in the switching device Q11a correspond with Lm_1 and Lm_2, inductances included in the capacitor 111 correspond with Lcap_1 and Lcap_2, and inductances of a wire connecting the switching device Q11a and the capacitor 111 correspond with Lm_3, Lm_4, Lw_1 and Lw_2. The inductances of the closed circuit including the switching device Q11a and the capacitor 111 are, therefore, composed of Lcap_1, Lcap_2, Lw_1, Lw_2, Lm_1, Lm_2, Lm_3, and Lm_4.

On the other hand, in the closed circuit including the switching device Q12a (switching device Q12) and the capacitor 111, inductances of a wire included in the switching device Q12a correspond with Lm_3 and Lm_4, inductances included in the capacitor 111 correspond with Lcap_1 and Lcap_2, and inductances of a wire connecting the switching device Q12a and the capacitor 111 correspond with Lm_1, Lm_2, Lw_1 and Lw_2. The inductances of the closed circuit including the switching device Q12a and the capacitor 111 are, therefore, composed of Lcap_1, Lcap_2, Lw_1, Lw_2, Lm_1, Lm_2, Lm_3, and Lm_4.

As described above, the equivalency circuit model shown in FIG. 4 shows a resonant circuit composed of the parasitic inductance components L and the parasitic capacitance components C.

The frequency $f_r$ in the equivalency circuit model shown in FIG. 4 can be calculated by applying Math 1 to the equivalency circuit. When actually calculating the frequency $f_r$, the following two cases are considered: (i) when the switching device Q11a is in the OFF state and the switching device Q12a is in the ON state; and (ii) when the switching device Q11a is in the ON state and the switching device Q12a is in the OFF state.

First, in the case of (1), the switching operation for switching off the switching device Q11a causes ringing voltage between the terminals of the switching device Q11a. In this case, the switching device Q12a can be considered as a simple wire. More accurately, the switching device Q12a can be considered as a resistor due to on-resistance of the switching device. Accordingly, the frequency $f_{r1}$ of the ringing voltage in the case (i) can be represented by Math 3.

$$f_{r1} = \frac{1}{2\pi\sqrt{(Lr) \times (Coss\_1)}} \quad \text{[Math 3]}$$

$$Lr = Lcap\_1 + Lcap\_2 + Lw\_1 + Lw\_2 + Lm\_1 + Lm\_2 + Lm\_3 + Lm\_4$$

Next, in the case of (2), the switching operation for switching off the switching device Q12a triggers ringing voltage that occurs between the terminals of the switching device Q12a. In this case, the switching device Q11a can be considered as a simple wire. More accurately, the switching device Q12a can be considered as a resistor due to on-resistance of the switching device. Accordingly, the frequency $f_{r2}$ of the ringing voltage in the case (ii) can be represented by Math 4.

$$f_{r2} = \frac{1}{2\pi\sqrt{(Lr) \times (Coss\_2)}} \quad \text{[Math 4]}$$

$$Lr = Lcap\_1 + Lcap\_2 + Lw\_1 + Lw\_2 + Lm\_1 + Lm\_2 + Lm\_3 + Lm\_4$$

Accordingly, Math 5 represents the frequency $f_r$ of the ringing voltage occurring at a time when the carrier signal Cr becomes greater than the U-phase control instruction signal Du, that is, when the switching device Q11a switches from the ON state to the OFF state and the switching device Q12a switches from the OFF state to the ON state.

$$f_r = \frac{1}{2\pi\sqrt{(Lr) \times (Coss)}}$$ [Math 5]

$Lr = \text{Lcap\_1} + \text{Lcap\_2} + \text{Lw\_1} +$
$\qquad \text{Lw\_2} + \text{Lm\_1} + \text{Lm\_2} + \text{Lm\_3} + \text{Lm\_4}$
$Coss = \text{Coss\_1} + \text{Coss\_2}$ According to Math 5, the frequency $f_r$ is not affected by the motor 104, and determined by the capacitor 111 and the U-phase arm 112u. The frequency $f_r$ can be calculated according to Math 5 in a design phase by calculating each parasitic inductance component such as Lm_1 and Lm_2 by using electromagnetical field simulation or the like. Further, when the frequency $f_r$ is calculated, a phase shift amount α sec is calculated according to Math 2. Thus, the predetermined phase difference α can be set in the design phase.

Note that although the frequency $f_r$ with respect to the U-phase arm 112u is calculated in FIG. 4, the V-phase arm 112v and the W-phase arm 112w are composed of the same components as those of the U-phase arm 112u in specifications, and accordingly frequency $f_r$ of a ringing voltage occurring due to switching operations in the V-phase arm 112v or the W-phase arm 112w is represented by Math 5.

<Conclusion>

Figure 5:
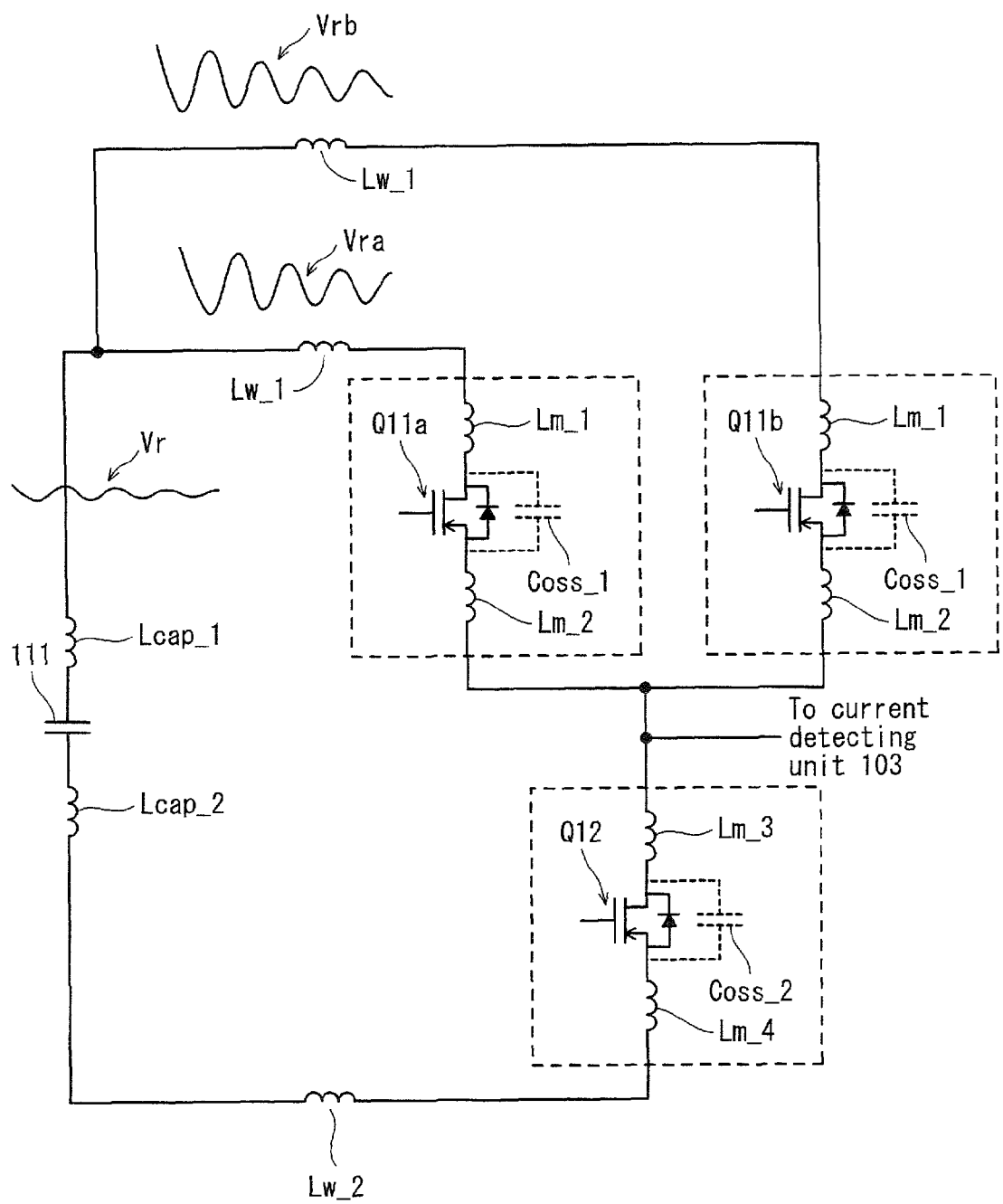
FIG. 5 explains an effect pertaining to Embodiment 1.

According to the structure of the power converter pertaining to the present embodiment, ringing voltages occurring between terminals of their respective switching devices are cancelled out. Further, unlike Patent Literature 1, according to the present embodiment, it is possible to reduce switching noise generated by each switching device within the closed circuits connecting the switching devices Q11a and Q11b and the capacitor 111, i.e., the source of the switching noise. FIG. 5 explains an effect pertaining to the present embodiment. In a similar manner to FIG. 4, FIG. 5 shows only the U-phase arm 112u and the capacitor 111. The switching device Q11a and the switching device Q11b that are included in the switching device Q11 are illustrated in a distinguished manner. The switching device Q12 is, however, simplified in a similar manner to FIG. 4.

As described above, since the switching device Q11a and Q11b are composed of switching devices that are the same in specifications, the switching device Q11a and Q11b have the same output capacitance (Coss_1) and the same inductances (Lm_1, Lm_2) of wires that connect these switching devices and other components. Further, when a wiring distance between the capacitor 111 and the switching device Q11a is the same as a wiring distance between the capacitor 111 and the switching device Q11b, an inductance of each wire can be defined as Lw_1. Accordingly, the ringing voltages Vra and Vrb occurring between terminals of switching devices Q11a and Q11b have the same frequency $f_r$.

As shown in FIG. 5, in the present embodiment, it is possible to cancel the ringing voltages Vra and Vrb out within the closed circuit connecting the switching devices Q11a and Q11b and the capacitor 111, and reduce the voltage change within the closed circuit as shown in FIG. 5 by using Vr. Accordingly, it is possible to expect the effect of reducing not only conductive noise conducting to the current power source via the parasitic capacitance and wires within the power converter but also radiation noise radiated to the space outside the power converter. Further, switching noise is reduced within the above-described closed circuit that is a source of the noise, and it is therefore possible to offer an effect of reducing both so-called normal mode noise and common mode noise.

Further, according to an approach of the present embodiment, the effect of reducing switching noise can be obtained without using various noise reducing components such as an EMI filter and a shield, unlike an approach in which ringing voltages are cancelled out at a point closer to the load (motor 104) than the three-phase inverter 102. Even if some noise reducing component is required, a noise reduction effect thereof may be small. Accordingly, the size of the load drive system 100 does not increase.

[Modification of Embodiment 1]

According to Embodiment 1 (FIG. 1), the PWM signal generating unit 107 generates a PWM signal, and the phase shifting unit 108 performs a phase shift on the generated PWM signal to generate a PWM signal for each switching device. In contrast, according to this modification, a carrier signal for each switching device is generated, and a PWM signal for each switching device is generated based on the generated carrier signal. The following describes the modification with reference to FIG. 6.

Figure 6:
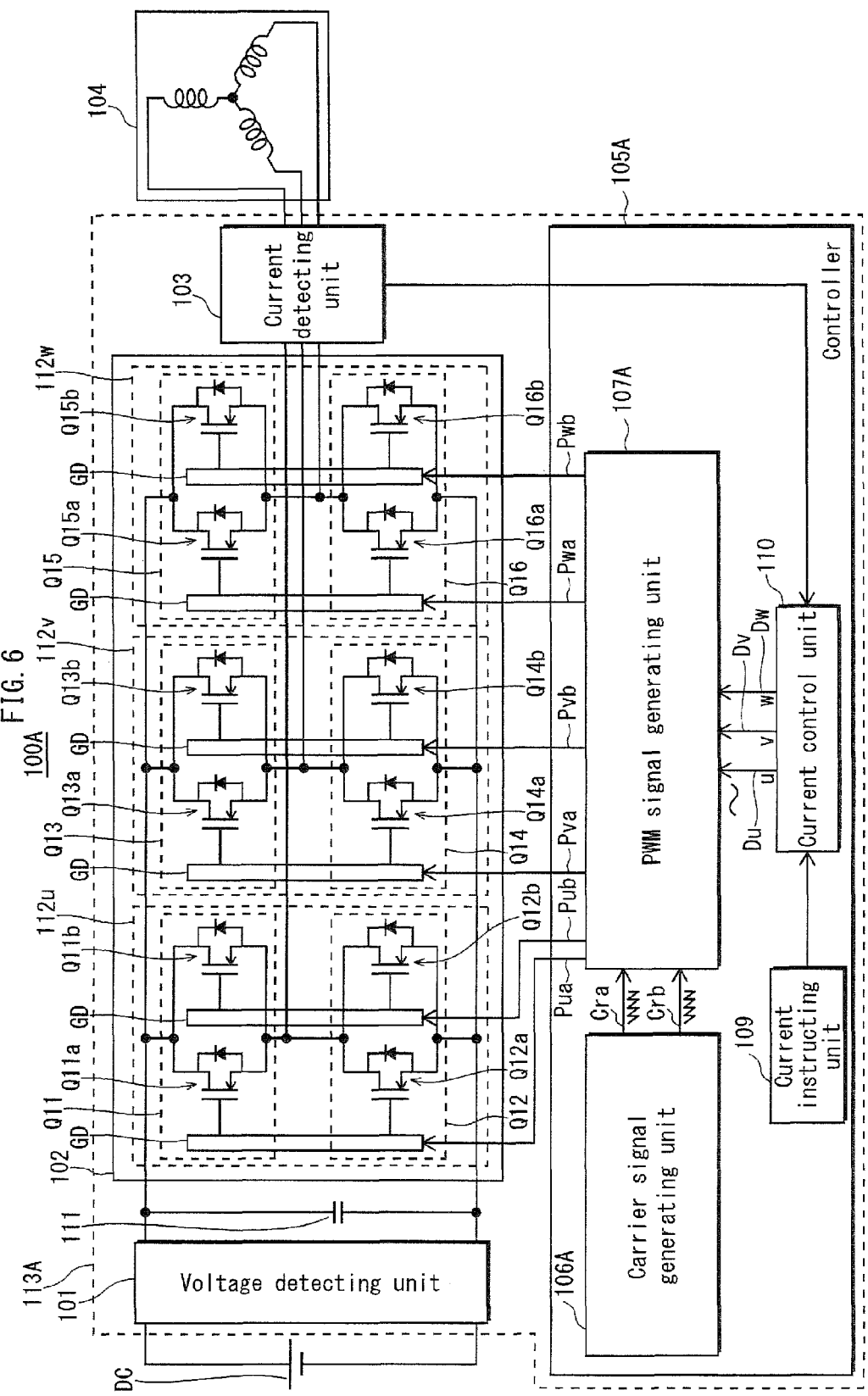
FIG. 6 shows an overall structure of a load drive system 100A provided with a power converter pertaining to a modification of Embodiment 1.

FIG. 6 shows an overall structure of a load drive system 100A provided with a power converter pertaining to the modification of Embodiment 1. The structure shown in FIG. 6 and Embodiment 1 (FIG. 1) are different in a structure of a controller 105A of a power converter 113A, that is, mainly in a carrier signal generating unit 106A and the PWM signal generating unit 107A. The following explanation focuses on the high-side switching device group Q11 of the U-phase arm 112u.

The carrier signal generating unit 106A generates sawtooth wave carrier signals Cra and Crb for generating PWM signals Pua and Pub for the switching devices Q11a and Q11b, respectively, and outputs the generated signals to the PWM signal generating unit 107A.

Figure 7:
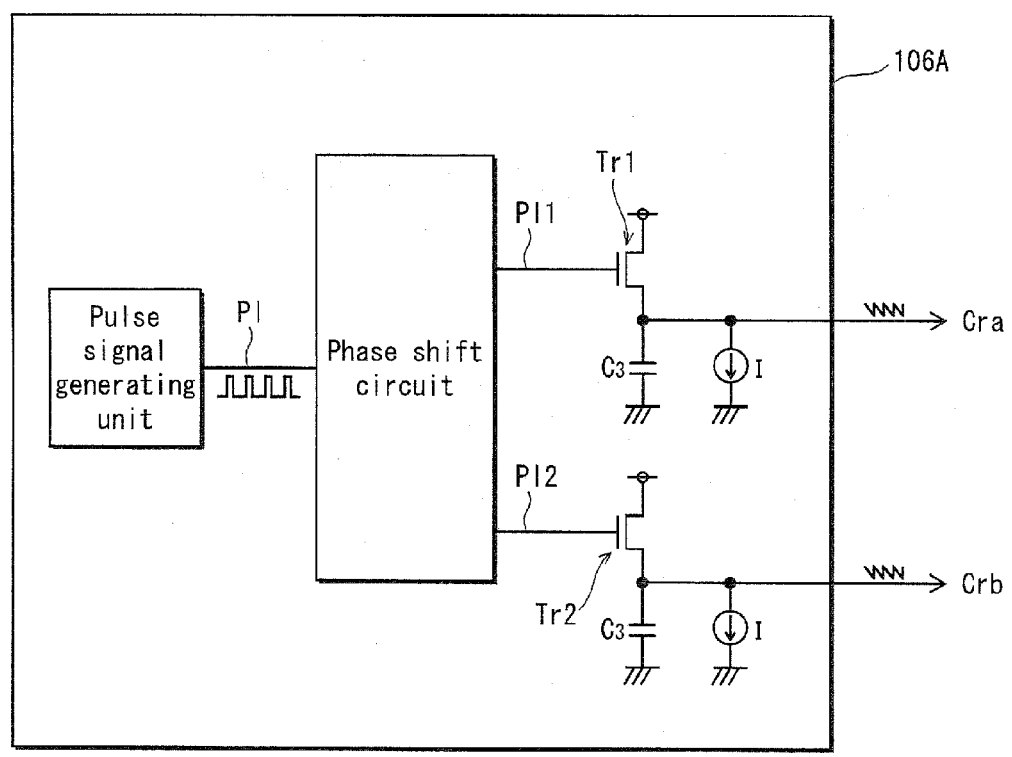
FIG. 7 is a circuit diagram showing an example of the structure of a carrier signal generating unit 106A pertaining to the modification of Embodiment 1.

FIG. 7 is a circuit diagram showing an example of the structure of the carrier signal generating unit 106A pertaining to the present modification.

A pulse signal generating unit generates a pulse signal P1 that is a narrow pulse waveform occurring at a predetermined interval, and outputs the pulse signal P1 to a phase shift circuit.

The phase shift circuit generates a pulse signal for each switching device based on the input pulse signal P1. The phase shift circuit generates a pulse signal P11 by shifting the pulse signal P1 by the third phase angle, and generates a pulse signal P12 by shifting the pulse signal P1 by the fourth phase angle. The fourth phase angle is delayed by α sec with respect to the third phase angle. The pulse signal P11 is output to a transistor Tr1, and the pulse signal P12 is output to a transistor Tr2.

The transistors Tr1 and Tr2 are cyclically turned ON for an instant when the pulse signals P11 and P12 are input. Further, since the pulse signal P12 is delayed by α sec with respect to the pulse signal P11, a timing at which the transistor Tr2 is turned ON is also delayed by α sec with respect to the transistor Tr1 accordingly.

While the transistor Tr1 (Tr2) is OFF, a capacitor C3 discharges to a constant current power source I, and the voltage of the capacitor C3 decreases at a constant speed. In contrast, while the transistor Tr1 (Tr2) is ON, the capacitor C3 is being charged up, and the voltage of the capacitor C3 cyclically and instantly increases. As a result, carrier signals Cra and Crb whose sawtooth waves are out of phase by α sec with respect to each other are generated by repeating to transition from the first level to the second level and then to reset to the first level from the second level.

Figure 3:
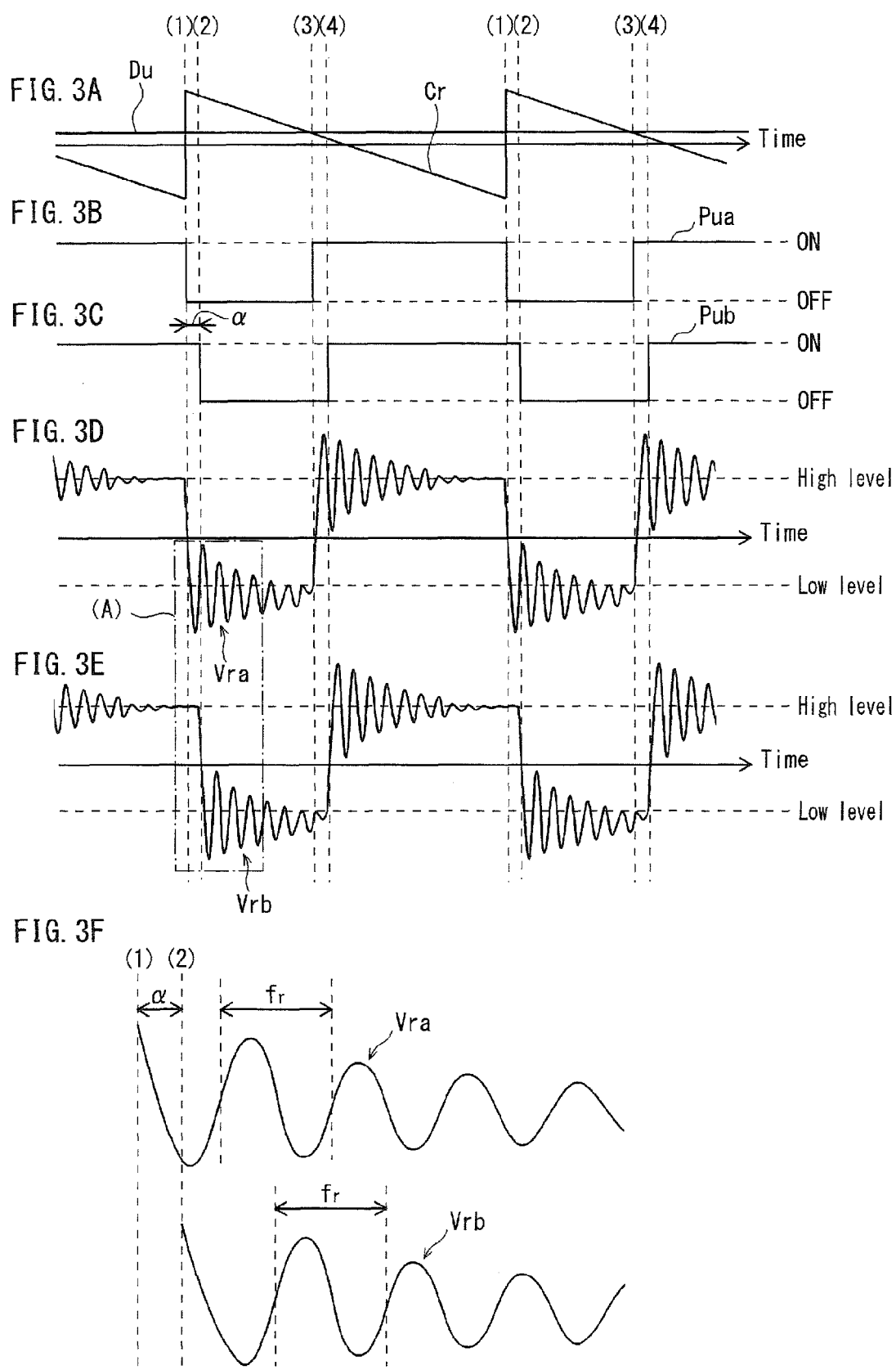
FIGS. 3A-3F are a timing chart pertaining to Embodiment 1.

Further, apart from the circuit structure shown in FIG. 7, the circuit structure disclosed in FIG. 3 of Patent Literature 2 can achieve this modification, for example.

The PWM signal generating unit 107A (FIG. 6) generates the PWM signal Pua for the switching device Q11a and the PWM signal Pub for the switching device Q11b based on the carrier signals Cra and Crb. The PWM signals Pua and Pub that are finally output to the switching devices Q11a and Q11b are the same as the PWM signals Pua and Pub (FIGS. 3B and 3C) pertaining to Embodiment 1.

Therefore, it is possible to obtain the noise reduction effect that is the same as Embodiment 1 according to the present modification.

[Embodiment 2]

According to the structure of Embodiment 1, the ringing voltages are cancelled out between the two switching devices. According to the present embodiment, the structure in which ringing voltages are cancelled out among three switching devices is explained.

<Structure>

Figure 8:
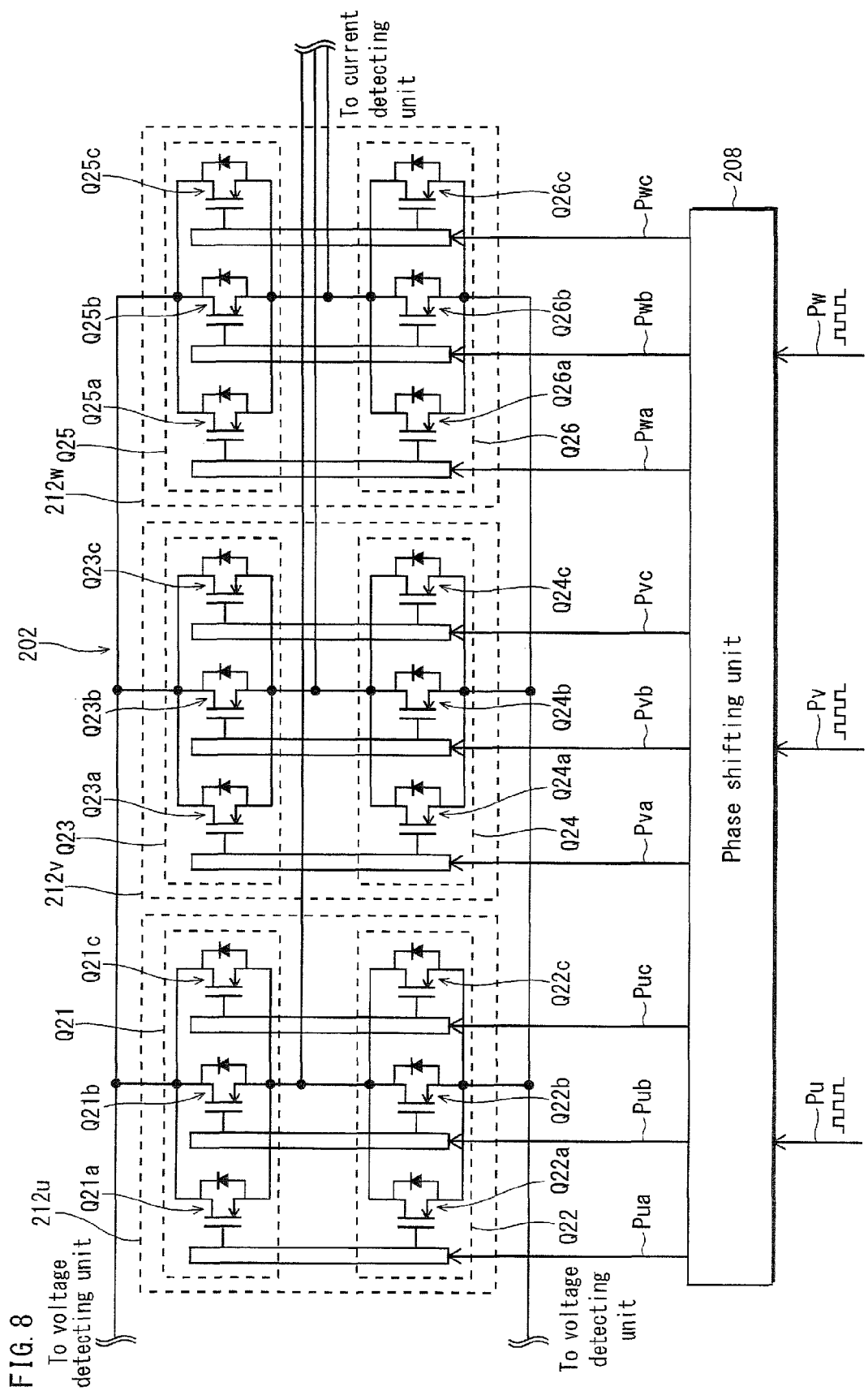
FIG. 8 shows a part of the structure of a load drive system pertaining to Embodiment 2.

FIG. 8 shows a part of a structure of a power converter pertaining to Embodiment 2, and in particular, a three-phase inverter 202 and a phase shifting unit 208.

The three-phase inverter 202 pertaining to the present embodiment includes, in a similar manner to Embodiment 1, a plurality of switching devices connected in parallel in each of the high-side switching device groups Q21, Q23 and Q25 and the low-side switching device groups Q22, Q24 and Q26 that constitute the U-phase arm 212u, the V-phase arm 212v, and the W-phase arm 212w. However, the number of switching devices connected in parallel is different from that of Embodiment 1.

As shown in FIG. 8, in the U-phase arm 212u, the high-side switching device group Q21 is composed of three switching devices Q21a, Q21b and Q21c connected in parallel, and the low-side switching device group Q22 is composed of three switching devices Q22a, Q22b and Q22c connected in parallel. Further, in a similar manner to the U-phase arm 212u, in the V-phase arm 212v, the high-side switching device group Q23 is composed of three switching devices Q23a, Q23b and Q23c connected in parallel, and the low-side switching device group Q24 is composed of three switching devices Q24a, Q24b and Q24c connected in parallel. Further, in the W-phase arm 212w as well, the high-side switching device group Q25 is composed of three switching devices Q25a, Q25b and Q25c connected in parallel, and the low-side switching device group Q26 is composed of three switching devices Q26a, Q26b and Q26c connected in parallel.

Note that the phase shifting unit 208 has approximately the same structure as the phase shifting unit 108 pertaining to Embodiment 1, and the structure not particularly shown in FIG. 8 is approximately the same as that of Embodiment 1. The following explanation focuses on the high-side switching device group Q21 of the U-phase arm 212u.

The phase shifting unit 208 generates the PWM signal Pua for the switching device Q21a, the PWM signal Pub for the switching device Q21b, and the PWM signal Puc for the switching device Q21c based on the PWM signal Pu input from the PWM signal generating unit (unillustrated), and outputs the generated signals to the gate drive circuits GDs. The phase shifting unit 208 generates the PWM signal Pua by shifting the PWM signal Pu by the first phase angle, generates the PWM signal Pub by shifting the PWM signal Pu by the second phase angle, and generates the PWM signal Puc by shifting the PWM signal Pu by the third phase angle. The second phase angle is delayed by α sec (described in Embodiment 1) with respect to the first phase angle, and the third phase angle is delayed by α sec with respect to the second phase angle.

Accordingly, timings of switching operations can be out of phase with respect to one another among the switching devices Q21a, Q21b and Q21c.

<Principle of Reduction of Switching Noise>

The principle of reduction of switching noise is described with reference to FIGS. 9A-9H. FIGS. 9A-9H are a timing chart pertaining to Embodiment 2. Here, only the high-side switching device group Q21 in the U-phase arm 212u is explained.

Figure 9:
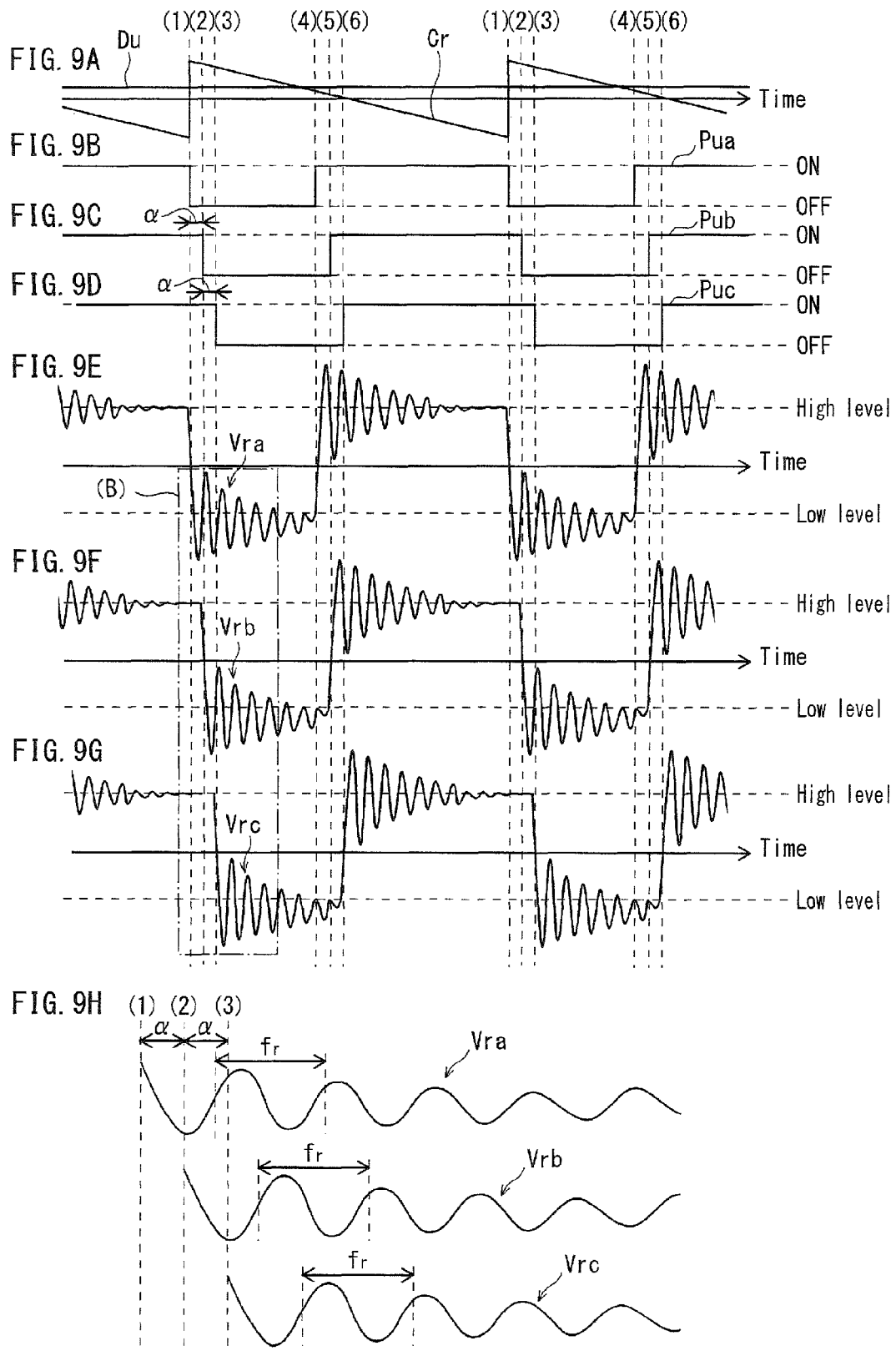
FIGS. 9A-9H is a timing chart pertaining to Embodiment 2.

FIG. 9A shows voltage waveforms of the sawtooth wave carrier signal Cr and the U-phase control instruction signal Du that are input to the PWM signal generating unit 107. These voltage waveforms are the same as those pertaining to Embodiment 1 (FIG. 3A).

FIG. 9B shows a voltage waveform of the PWM signal Pua output from the phase shifting unit 208. FIG. 9C shows a voltage waveform of the PWM signal Pub. FIG. 9D shows a voltage waveform of the PWM signal Puc. As shown in FIGS. 9B, 9C and 9D, the PWM signal Puc is delayed by 2α sec (α is the same as one explained in Embodiment 1) with respect to the PWM signal Pua, and is delayed by α sec with respect to the PWM signal Pub.

FIG. 9E shows the voltage change between terminals of the switching device Q21a. FIG. 9F shows the voltage change between terminals of the switching device Q21b. FIG. 9G shows the voltage change between terminals of the switching device Q21c. FIG. 9H is an enlarged view in the vicinity of an area (B) shown in FIGS. 9E, 9F and 9G.

In the following description, it is assumed that when the U-phase control instruction signal Du becomes greater than the carrier signal Cr, the PWM signal Pua transitions from the ON state to the OFF state in a similar manner to Embodiment 1.

First, description is made on time (1) shown in FIGS. 9A-9H. In FIG. 9A, when the carrier signal Cr and the U-phase control instruction signal Du intersect, the PWM signal Pua shown in FIG. 9B transitions from the ON state to the OFF state. In accordance with the transition, the switching device Q21a switches from the ON state to the OFF state, and the voltage between the terminals of the switching device Q21a transitions from high level to low level (FIG. 9E). At this time, the ringing voltage Vra occurs between terminals of the switching device Q21a.

Next, description is made on time (2) shown in FIGS. 9A-9H. The PWM signal Pub shown in FIG. 9C transitions from the ON state to the OFF state after a delay of α sec from the time (1). In accordance with the transition, the switching device Q21b switches from the ON state to the OFF state, and the voltage between the terminals of the switching device Q21b transitions from high level to low level (FIG. 9F). At this time, the ringing voltage Vrb occurs between terminals of the switching device Q21b.

Then, as shown in FIG. 9H, a phase of the ringing voltage Vra is inverted with respect to a phase of the ringing voltage Vrb. According to this, the ringing voltages Vra and Vrb, which occur in accordance with the switching operations of the switching devices Q21a and Q21b for switching from the ON state to the OFF state, are cancelled out. As a result, switching noise generated by these switching devices can be reduced.

Next, description is made on time (3) shown in FIGS. 9A-9H. The PWM signal Puc shown in FIG. 9D transitions from the ON state to the OFF state after a delay of α sec from the time (2), and after a delay of 2α sec from the time (1). In accordance with the transition, the switching device Q21c switches from the ON state to the OFF state, and the voltage between the terminals of the switching device Q21c transitions from high level to low level (FIG. 9G). At this time, the ringing voltage Vrc occurs between terminals of the switching device Q21c. The ringing voltage Vrc is not cancelled out with another ringing voltage. The ringing voltage Vrc therefore remains as is.

Next, description is made on time (4). In FIG. 9A, when the carrier signal Cr and the U-phase control instruction signal Du intersect, the PWM signal Pua shown in FIG. 9B transitions from the OFF state to the ON state. In accordance with the transition, the switching device Q21a switches from the OFF state to the ON state, and the voltage between the terminals of the switching device Q21a transitions from low level to high level (FIG. 9E). At this time as well, like the time (1), the ringing voltage Vra occurs between the terminals of the switching device Q21a.

Next, at time (5), the PWM signal Pub shown in FIG. 9C transitions from the OFF state to the ON state after a delay of α sec from the time (4). In accordance with the transition, the switching device Q21b switches from the OFF state to the ON state, and the voltage between the terminals of the switching device Q21b transitions from low level to high level (FIG. 9F). At this time as well, like the time (2), the ringing voltage Vrb occurs between the terminals of the switching device Q21b.

Next, description is made on time (6) shown in FIGS. 9A-9G. The PWM signal Puc shown in FIG. 9D transitions from the OFF state to the ON state after a delay of α sec from the time (5), and after a delay of 2α sec from the time (4). In accordance with the transition, the switching device Q21c switches from the OFF state to the ON state, and the voltage between the terminals of the switching device Q21c transitions from low level to high level (FIG. 9G). At this time as well, like the time (3), the ringing voltage Vrc occurs between the terminals of the switching device Q21c. The ringing voltage Vrc is not cancelled out with another ringing voltage. The ringing voltage Vrc therefore remains as is.

As described above, according to the above structure, it is possible to cancel out both the ringing voltages Vra and Vrb that occur in accordance with the transition of the switching devices from the ON state to the OFF state and that occur in accordance with the transition from the OFF state to the ON state. On the other hand, since the ringing voltage Vrc remains without being cancelled out, the switching noise reduction effect is inferior compared with Embodiment 1. However, compared with the conventional case where three switching devices operate in synchronization with one another, switching noise can be reduced to approximately a third.

[Modification of Embodiment 2]

According to this modification, ringing voltages are cancelled out among three switching devices in a similar manner to Embodiment 2. The following explains the structure for achieving particularly excellent noise reduction effect when each of the ringing voltages occurring at the switching devices is an ideal sine wave.

The structure of the present modification is the same as Embodiment 2 (FIG. 8). The phase shifting unit pertaining to the present modification generates, in a similar manner to the phase shifting unit 208 pertaining to Embodiment 2, the PWM signals Pua, Pub and Puc. While the predetermined phase difference is α sec in Embodiment 2, the predetermined phase difference is β sec in the present modification. The phase difference β is defined by Math 6 with use of the frequency $f_r$ of the ringing voltage occurring at a switching device.

$$\beta = \left(\frac{1}{f_r}\right) \times \left(\frac{120}{360}\right) \qquad \text{[Math 6]}$$

As could be seen from Math 6, the phase difference β corresponds with a third of the cycle of the ringing voltage. The concrete principle of reduction of switching noise pertaining to the present modification is described with reference to FIGS. 10A-10C.

Figure 10:
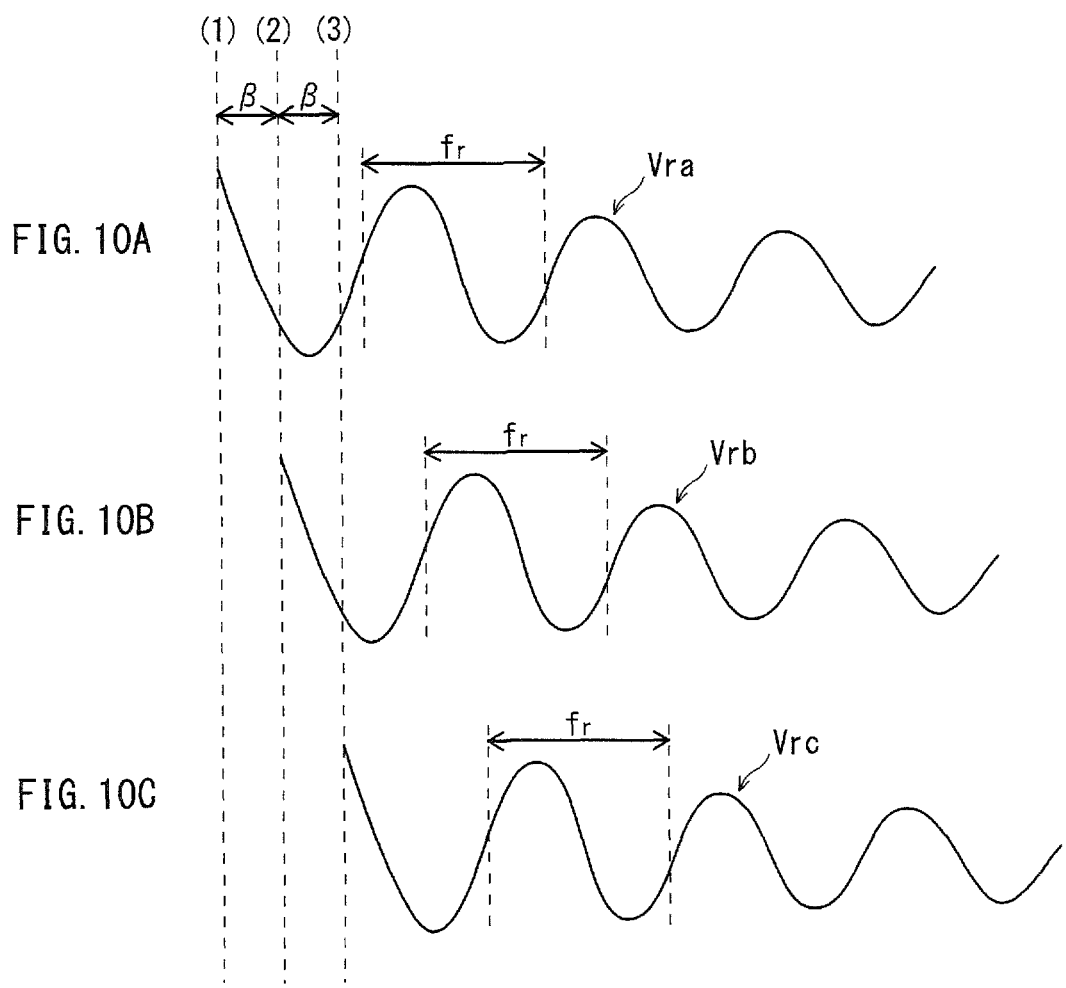
FIGS. 10A-10C is a timing chart pertaining to a modification of Embodiment 2.

FIGS. 10A-10C show a timing chart pertaining to the present modification. FIGS. 10A, 10B and 10C are enlarged views of waveforms of ringing voltages Vra, Vrb and Vrc occurring at switching devices Q21a, Q21b and Q21c, respectively. By setting the phase difference β to a value that corresponds with a third of the cycle of each ringing voltage, when the ringing voltages Vra, Vrb and Vrc are perfect sine waves, the sum of these ringing voltages equals zero, and the ringing voltages are cancelled out.

In practice, since the ringing voltages Vra, Vrb and Vrc are not perfect sine waves, the sum of the ringing voltages does not become zero. However, an efficient switching noise reduction effect can still be expected.

[Embodiment 3]

According to Embodiment 1, description has been made on the following structure: in the three-phase inverter in which the two switching devices are connected in parallel so as to double the rated current, these switching devices are controlled to perform switching at different timings so that ringing voltages generated by these switching devices are cancelled out. According to Embodiment 3, ringing voltages are cancelled out among a U-phase arm, a V-phase arm, and a W-phase arm by shifting switching timings of a switching device constituting the U-phase arm, a switching device constituting the V-phase arm, and a switching device constituting the W-phase arm.

<Structure>

Figure 11:
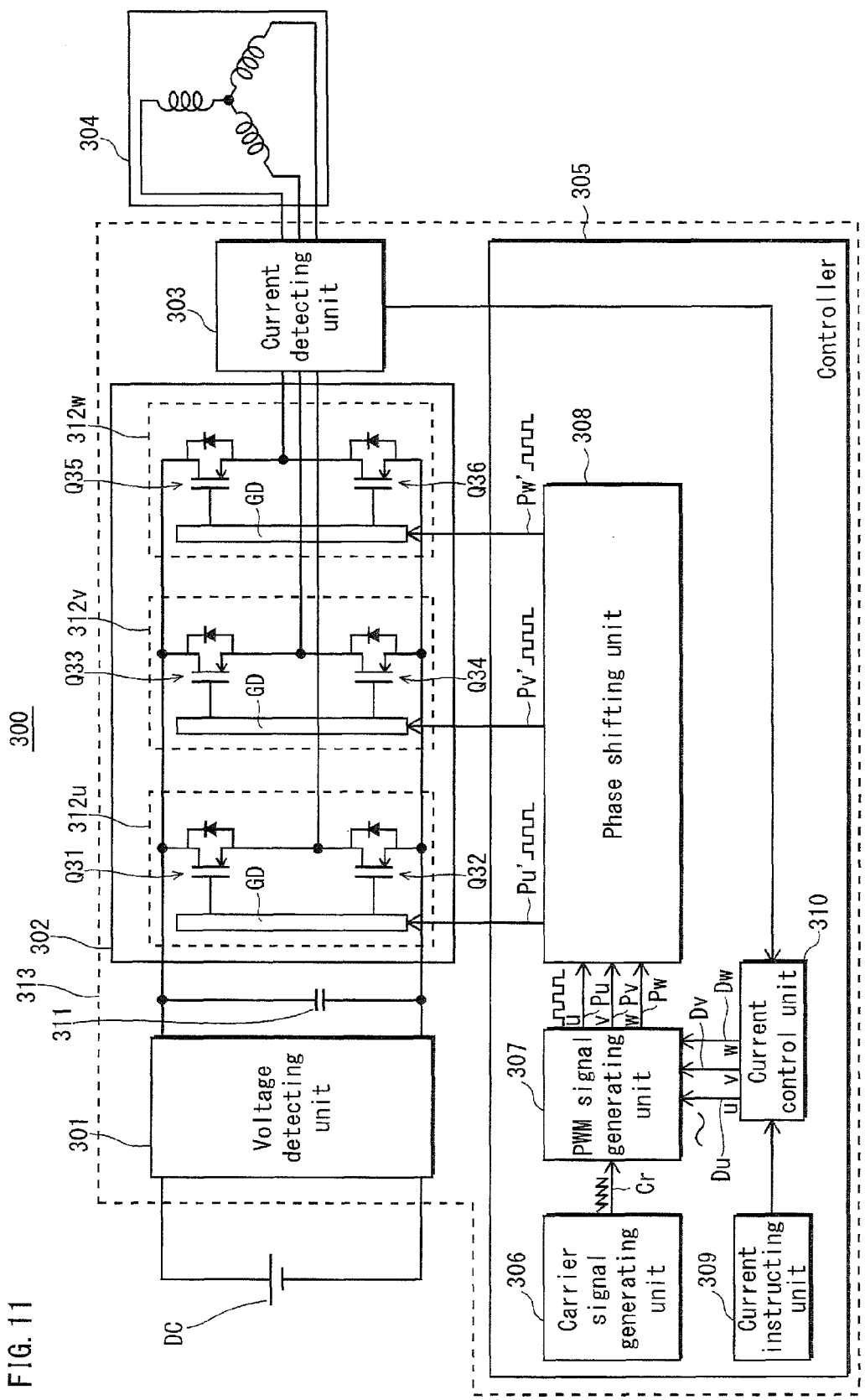
FIG. 11 shows an overall structure of a load drive system 300 provided with a power converter pertaining to Embodiment 3.

FIG. 11 shows an overall structure of a load drive system 300 provided with a power converter pertaining to Embodiment 3.

The load drive system 300 includes a direct current power source DC, a power converter 313, and a motor 304. Although the direct current power source DC and the motor 304 are respectively the same as direct current power source DC and the motor 104 pertaining to Embodiment 1 in structure, the power converter 313 is different from the power converter 113 pertaining to Embodiment 1 in structure.

The power converter 313 includes a voltage detecting unit 301, a current detecting unit 303, a three-phase inverter 302, and a controller 305. The voltage detecting unit 301 and the current detecting unit 303 are respectively the same as the voltage detecting unit 101 and the current detecting unit 103 pertaining to Embodiment 1 in structure. The three-phase inverter 302 and the controller 305 are, however, different from the three-phase inverter 102 and the controller 105 pertaining to Embodiment 1 in structure.

The three-phase inverter 302 is provided with a U-phase arm 312u, a V-phase arm 312v and W-phase arm 312w. The U-phase arm 312u is further composed of a high-side switching device Q31 and a low-side switching device Q32 that are connected in parallel. Unlike Embodiment 1, the high-side switching device Q31 and the low-side switching device Q32 pertaining to the present Embodiment are each composed of a single switching device.

The V-phase arm 312v and the W-phase arm 312w are the same as the U-phase arm 312u in structure. The switching devices Q31-Q36 are each composed of the same switching device.

In the power converter 313 pertaining to the present embodiment, a closed circuit including the capacitor 311 and any one of the U-phase arm 312u, V-phase arm 312v and W-phase arm 312w is provided for each arm. For example, one closed circuit includes the U-phase arm 312u and the capacitor 311. The power converter 313 includes as many closed circuits as the number of arms (3). The following mainly explains the high-side switching devices Q31, Q33 and Q35.

The controller 305 is composed of a carrier signal generating unit 306, a PWM signal generating unit 307, a phase shifting unit 308, a current instructing unit 309, and a current control unit 310. The carrier signal generating unit 306, the PWM signal generating unit 307, the current instructing unit 309, and the current control unit 310 are respectively the same as the carrier signal generating unit 106, the PWM signal generating unit 107, the current instructing unit 109, and the current control unit 110 pertaining to Embodiment 1 in structure. The phase shifting unit 308 is, however, different from the phase shifting unit 108 pertaining to Embodiment 1 in structure.

The phase shifting unit 308 generates, based on the input PWM signals Pu, Pv and Pw, a PWM signal Pu' that is to be output to the high-side switching device Q31, a PWM signal Pv' that is to be output to the high-side switching device Q33, and a PWM signal Pw' that is to be output to the high-side switching device Q35. The phase shifting unit 308 then outputs these generated signals to the gate drive circuits GDs. The phase shifting unit 308 generates the PWM signal Pu' by shifting the PWM signal Pu by the first phase angle, generates the PWM signal Pv' by shifting the PWM signal Pv by the second phase angle, and generates the PWM signal Pw' by shifting the PWM signal Pw by the third phase angle. The second phase angle is delayed by α sec (same as one described in Embodiment 1) with respect to the first phase angle, and the third phase angle is delayed by α sec with respect to the second phase angle.

According to this, it is possible to shift timings of switching operations with respect to one another among the high-side switching devices Q31, Q33 and Q35.

Here, a frequency of a ringing voltage occurring due to the switching operation of the switching device Q31 of the U-phase arm 312u within the closed circuit including the U-phase arm 312u and the capacitor 311 is determined by an inductance included in the closed circuit and an output capacitance of the switching device Q31 constituting the arm included in the closed circuit. In addition, in FIG. 4, if the switching devices Q11 and Q12 are respectively replaced with the switching devices Q31 and Q32 pertaining to the present Embodiment, FIG. 4 shows the closed circuit including the U-phase arm 312u and the capacitor 311. Accordingly, the calculating method for the frequency $f_r$ explained with reference to FIG. 4 can be applied to the present embodiment.

In the closed circuit including the U-phase arm 312u and the capacitor 311, inductances of a wire included in the switching device Q31 correspond with Lm_1 and Lm_2, inductances included in the capacitor 311 correspond with Lcap_1 and Lcap_2, and inductances of a wire connecting the switching device Q31 and the capacitor 311 correspond with Lm_3, Lm_4, Lw_1 and Lw_2. The inductances included in the closed circuit are, therefore, composed of Lcap_1, Lcap_2, Lw_1, Lw_2, Lm_1, Lm_2, Lm_3, and Lm_4.

<Principle of Reduction of Switching Noise>

The principle of reduction of switching noise is described with reference to a timing chart shown in FIGS. 12A-12H.

Figure 12:
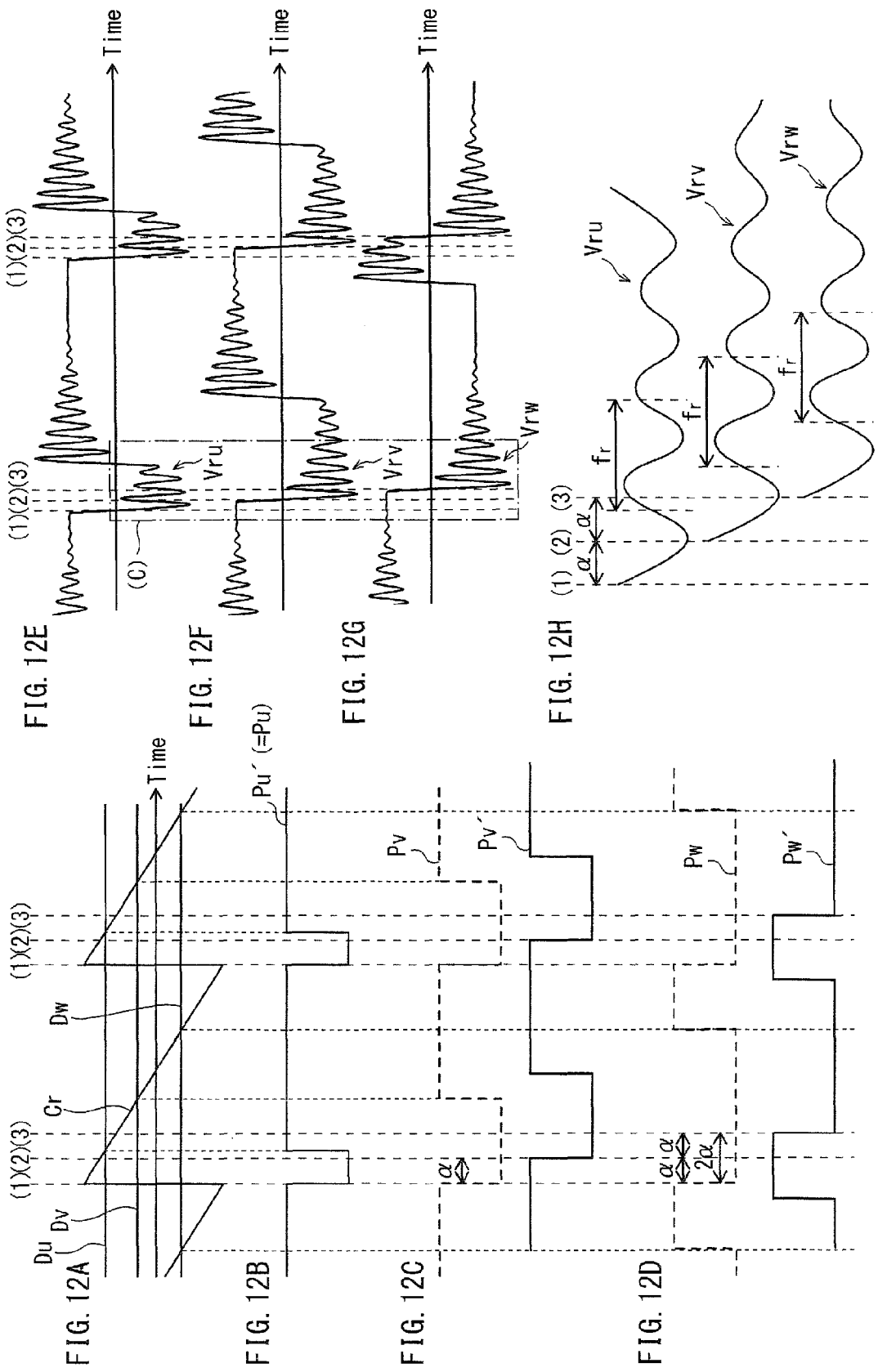
FIGS. 12A-12H are a timing chart pertaining to Embodiment 3.

FIG. 12A shows voltage waveforms of the sawtooth wave carrier signal Cr, the U-phase control instruction signal Du, the V-phase control instruction signal Dv, and the W-phase control instruction signal Dw. The carrier signal Cr is a sawtooth wave in a similar manner to Embodiment 1. The U-phase control instruction signal Du, the V-phase control instruction signal Dv and the W-phase control instruction signal Dw are out of phase by 120°, and in electrical angle by 2π/3 radians with respect to one another.

FIG. 12B shows a voltage waveform of the PWM signal Pu' that is output from the phase shifting unit 308.

FIG. 12C shows a voltage waveform (dotted line) of the PWM signal Pv that is input to the phase shifting unit 308, and the PWM signal Pv' (solid line) that is output from the phase shifting unit 308. The PWM signal Pv' is delayed by α sec with respect to the PWM signal Pv.

FIG. 12D shows a voltage waveform (dotted line) of the PWM signal Pw that is input to the phase shifting unit 308, and the PWM signal Pw' (solid line) that is output from the phase shifting unit 308. The PWM signal Pw' is delayed by 2a sec with respect to the PWM signal Pw.

FIG. 12E shows the voltage change between terminals of the high-side switching device Q31. FIG. 12F shows the voltage change between terminals of the high-side switching device Q33. FIG. 12G shows the voltage change between terminals of the high-side switching device Q35. FIG. 12H is an enlarged view in the vicinity of an area (C) shown in FIGS. 12E, 12F and 12G.

In the following explanation, it is assumed that when the carrier signal Cr becomes greater than the control instruction signals Du, Dv and Dw, the ON state transitions to the OFF state.

First, description is made on time (1) shown in FIGS. 12A-12H. In FIG. 12A, when the carrier signal Cr and the U-phase control instruction signal Du intersect, the PWM signal Pu' shown in FIG. 12B transitions from the ON state to the OFF state. In accordance with the transition, the high-side switching device Q31 switches from the ON state to the OFF state, and the voltage between the terminals of the high-side switching device Q31 transitions from high level to low level (FIG. 12E). At this time, the ringing voltage Vru occurs between terminals of the high-side switching device Q31.

Here, when a sawtooth wave is used as a carrier signal like the present embodiment, the control instruction signals Dv and Dw also intersect the carrier signal Cr at the time (1). Accordingly, each of the PWM signals Pv and Pw output from the PWM signal generating unit 307 also transitions from the ON state to the OFF state. If these PWM signals Pv and Pw are output to gate terminals of the high-side switching devices Q33 and Q35 without being out of phase by the phase shifting unit 308, the high-side switching devices Q31, Q33 and Q35 performs switching operations at the same time. In this case, ringing voltages having the same phase are generated by the high-side switching devices Q31, Q33 and Q35, and switching noises accordingly are triply superimposed. Therefore, in the preset embodiment, the phase shifting unit 308 shifts phases of the PWM signals Pv and Pw such that switching operations are not performed at the same time.

Next, description is made on time (2) shown in FIGS. 12A-12H. Due to the above-described reason, the PWM signal Pv' output from the phase shifting unit 308 is provided with a phase difference of α sec with respect to the PWM signal Pv (FIG. 12C). Here, α is defined by Math 2 pertaining to Embodiment 1. In the present embodiment, the frequency $f_r$ of Math 2 is the frequency of the ringing voltage Vru occurring at the high-side switching device Q31. Note that as described above, the switching devices Q31-Q36 are composed of switching devices that are the same in specifications such as withstand voltage and ampacity. Accordingly, a frequency of a ringing voltage occurring at each switching device has the same value.

At the time (2) shown in FIGS. 12A-12H, the PWM signal Pv' shown in FIG. 12C transitions from the ON state to the OFF state after a delay of α sec from the time (1). In accordance with the transition, the high-side switching device Q33 switches from the ON state to the OFF state, and the voltage between the terminals of the high-side switching device Q33 transitions from high level to low level (FIG. 12F). At this time, the ringing voltage Vrv occurs between terminals of the high-side switching device Q33.

As a result, as shown in FIG. 12H, a phase of the ringing voltage Vru is inverted with respect to a phase of the ringing voltage Vrv. According to this, the ringing voltages Vru and Vrv, which occur in accordance with the switching operations of the high-side switching devices Q31 and Q33 for switching from the ON state to the OFF state, are cancelled out. As a result, switching noise generated by these switching devices can be reduced.

Next, description is made on time (3) shown in FIGS. 12A-12H. For the same reason as the V-phase, the PWM signal Pw' shown in FIG. 12D transitions from the ON state to the OFF state after a delay of 2α sec from the time (1). In accordance with the transition, the high-side switching device Q35 switches from the ON state to the OFF state, and the voltage between the terminals of the high-side switching device Q35 transitions from high level to low level (FIG. 12G). At this time, the ringing voltage Vrw occurs between the terminals of the high-side switching device Q35. The ringing voltage Vrw is not cancelled out with another ringing voltage. The ringing voltage Vrw therefore remains as is.

As described above, according to the above structure, when the ringing voltages Vru and Vrv occur in accordance with the transition of the switching devices from the ON state to the OFF state, it is possible to cancel the ringing voltages Vru and Vrv out. On the other hand, since the ringing voltage Vrw remains without being cancelled, the switching noise reduction effect is inferior compared with Embodiment 1. However, as indicated by dashed lines in FIGS. 12B-12D, compared with the case where three switching devices of the U-phase, the V-phase and the W-phase perform switching operations at the same time, switching noise can be reduced to approximately a third.

Further, like the present embodiment, in order to cancel the ringing voltages out among the switching devices of the U-phase, the V-phase and the W-phase, using a carrier signal such as a sawtooth wave is desirable. That is, a carrier signal that transitions gradually from a first level to a second level, and then resets to the first level from the second level is desirable. When such a carrier signal is used, at a time when the carrier signal is reset (time (1) in FIGS. 12A-12H), all of the PWM signals of the U-phase, the V-phase and the W-phase transition from the ON state to the OFF state (or the OFF state to the ON state). As a result, the switching devices of the U-phase, the V-phase and the W-phase perform switching operations at the same time, and accordingly switching noise might increase.

As described above, the timings of the switching operations correspond cyclically with a timing at which the carrier signal is reset, and do not change according to the duty ratio.

In the present embodiment, it is possible to control a timing of a switching operation of a switching device of each phase by focusing on a point that the timing at which switching operations are performed at the same time does not change according to the duty ratio and using the timing as a criterion for phase shift.

Note that according to Embodiment 1, it is possible to cancel both the ringing voltage occurring in accordance with transition from the ON state to the OFF state of the switching device and the ringing voltage occurring in accordance with the transition from the OFF state to the ON state. According to the present embodiment, however, a ringing voltage that can be cancelled is limited to one of them. This is because, as shown in FIGS. 12B-12D, while the carrier signal is increasing gradually from the first level to the second level, timings at which the carrier signal and the control instruction signals intersect change according to the duty ratio. It is therefore difficult to use the timings at which the carrier signal and the control instruction signals intersect as a criterion for phase shift. However, since one of the ringing voltages can be cancelled, it is possible to reduce a noise level to approximately a half, compared with a case where a PWM signal of each phase is not out of phase.

Note that like the modification of Embodiment 1 (FIG. 6), it is possible to generate beforehand, for each phase, a carrier signal with a predetermined phase difference among phases, and generate a PWM signal for each phase based on the generated carrier signal.

<Validation of Principle of Reduction of Switching Noise>

Figure 13:
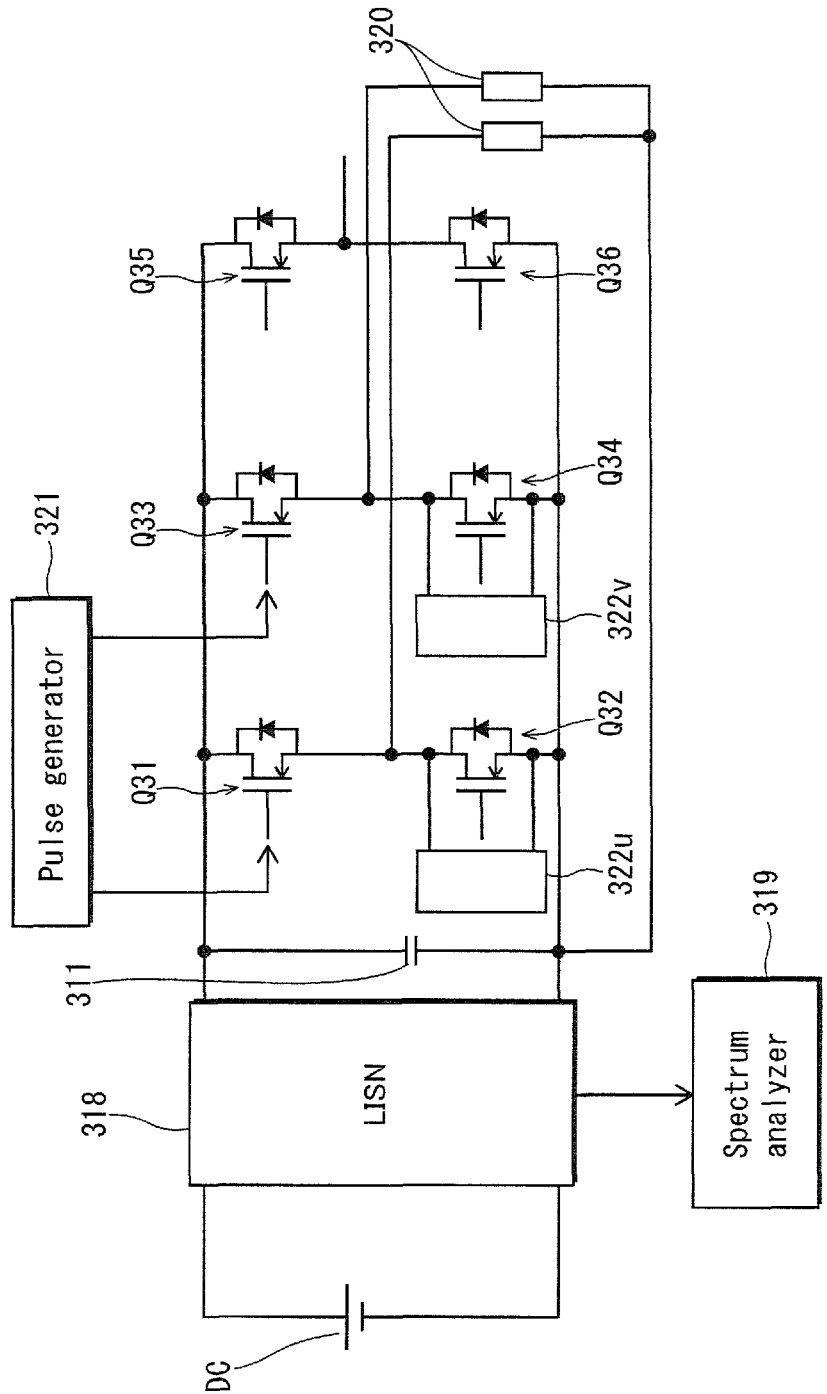
FIG. 13 shows the structure of a circuit for verifying the principle of reduction of switching noise pertaining to Embodiment 3.
Figure 15:
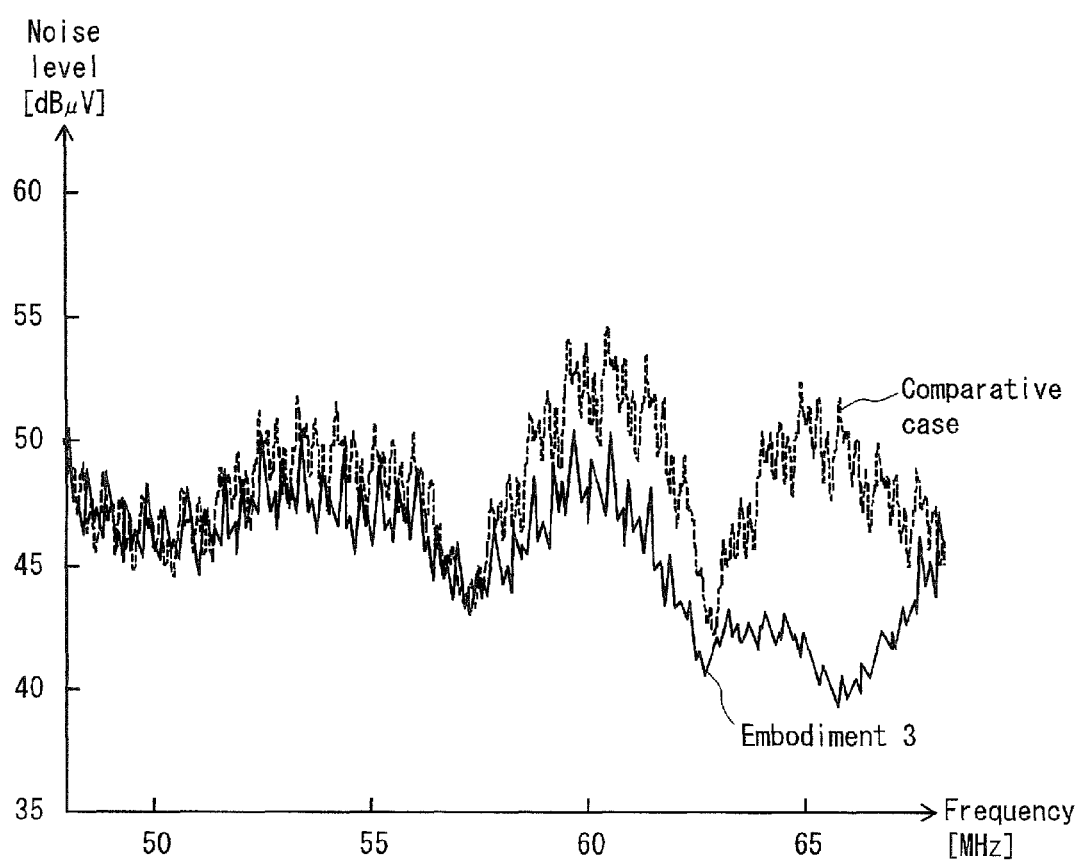
FIG. 15 shows noise levels measured close to a direct current power source DC pertaining to Embodiment 3 and the comparative case.

The following explains a validation result of principle of reduction of switching noise pertaining to the present embodiment with reference to FIGS. 13 through 15.

The validation of principle of reduction of switching noise pertaining to the present embodiment was specifically performed with use of a circuit shown in FIG. 13. The circuit for validation shown in FIG. 13 is based on the circuit shown in FIG. 11. Components that are the same as those of FIG. 11 are assigned the same reference numbers.

First, a pulse generator 321 transmits pulse signals to gate terminals of the high-side switching devices Q31 and Q33. When such pulse signals are input, the high-side switching devices Q31 and Q33 perform switching operations. Here, the pulse signals output from the pulse generator 321 have a time difference between the high-side switching devices Q31 and Q33. This causes the switching operations to be performed at different timings.

Next, voltages between terminals of the low-side switching device Q32 and Q34 while the high-side switching devices Q31 and Q33 are performing switching operations were respectively observed by a U-phase voltage detecting unit 322u and a V-phase voltage detecting unit 322v. Note that a load 320 is connected to the U-phase arm and the V-phase arm.

The voltage changes between terminals of the low-side switching devices Q32 and Q34, which were observed by the voltage detecting units 322u and 322v, are shown in FIGS. 14A and 14B. FIG. 14A shows a result of a case where it is assumed that a switching operation pertaining to the present embodiment is performed, and FIG. 14B shows a result of comparative case. Further, in each figure, the voltage change between the terminals of the low-side switching device Q32 is indicated by a solid line, and the voltage change between the terminals of the low-side switching device Q34 is indicated by a dotted line.

In FIG. 14A assuming the present embodiment, a time difference between the pulse signals input to the high-side switching devices Q31 and Q33 is the above α sec, and the phases of ringing voltages are inverted with each other. In contrast, in FIG. 14B of the comparative case, a time difference between input pulse signals is approximately zero, and the phases of ringing voltages are approximately the same.

Subsequently, a line impedance stabilization network (LISN) 318 (FIG. 13) was connected between the direct current power source DC and the three-phase inverter, and a spectrum analyzer 319 measured a noise spectrum while voltages between the terminals of the low-side switching devices Q32 and Q34 were changing as shown in FIG. 14. The result of this case is shown in FIG. 15. In FIG. 15, a solid line indicates the result pertaining to the present embodiment (corresponding with FIG. 14A), and a dotted line indicates the result pertaining to the comparative case (corresponding with FIG. 14B).

As shown in FIG. 15, according to the comparative case, a peak value indicating a great noise level is observed in frequency bands of 60 MHz and 65 MHz. In contrast, according to the present embodiment, it was proved that in frequency bands of 60 MHz and 65 MHz, approximately 4 dB and 10 dB of noise can be reduced, respectively. When focusing on details of FIG. 14A, a period of 50 nsec corresponds with the period of approximately three cycles of a ringing voltage. It is proved from this fact that the period of one cycle of the ringing voltage is approximately 16.7 nsec. The inverse of 16.7 nsec is approximately 60 MHz, which corresponds with a frequency band in which noise reduction effect was evident in FIG. 15.

Accordingly, it was shown that noise conducting from the three-phase inverter to direct current power source DC was reduced by cancelling the ringing voltages out.

In the present embodiment, the switching devices according to which the ringing voltages are cancelled out have different phases. Accordingly, PWM signals input to these switching devices are generated based on control instruction signals having different phases. In contrast, according to Embodiments 1 and 2 and modifications thereof, the switching devices according to which the ringing voltages are cancelled out have the same phase. Accordingly, PWM signals input to these switching devices are generated based on the same control instruction signal. Accordingly, like an embodiment such as Embodiments 1 and 2 and modifications thereof, it is possible to more effectively reduce noise when the switching devices having the same phase cancel the ringing voltages out.

[Modification of Embodiment 3]

According to this modification, ringing voltages are cancelled out among three switching devices of the U-phase, the V-phase and the W-phase in a similar manner to Embodiment 3. The following explains the structure for achieving particularly excellent noise reduction effect when each of the ringing voltages occurring among the switching devices is an ideal sine wave.

The structure of the present modification is the same as Embodiment 3 (FIG. 11). The phase shifting unit pertaining to the present modification generates, in a similar manner to the phase shifting unit 308 pertaining to Embodiment 3, the PWM signals Pu', Pv' and Pw'. While the predetermined phase difference is α sec in Embodiment 3, while the predetermined phase difference is β sec in the present modification. In a similar manner to the modification of the Embodiment 2, the phase difference β is defined by Math 6 with use of the frequency $f_r$ of a ringing voltage occurring at a switching device. According to the present modification, the frequency $f_r$ of Math 6 is a frequency of the ringing voltage Vru occurring at the high-side switching device Q31.

In a similar manner to Embodiment 2, the phase difference β corresponds with a third of the cycle of a ringing voltage. Next, the concrete principle of reduction of switching noise pertaining to the present modification is described with reference to FIGS. 16A-16C.

Figure 16:
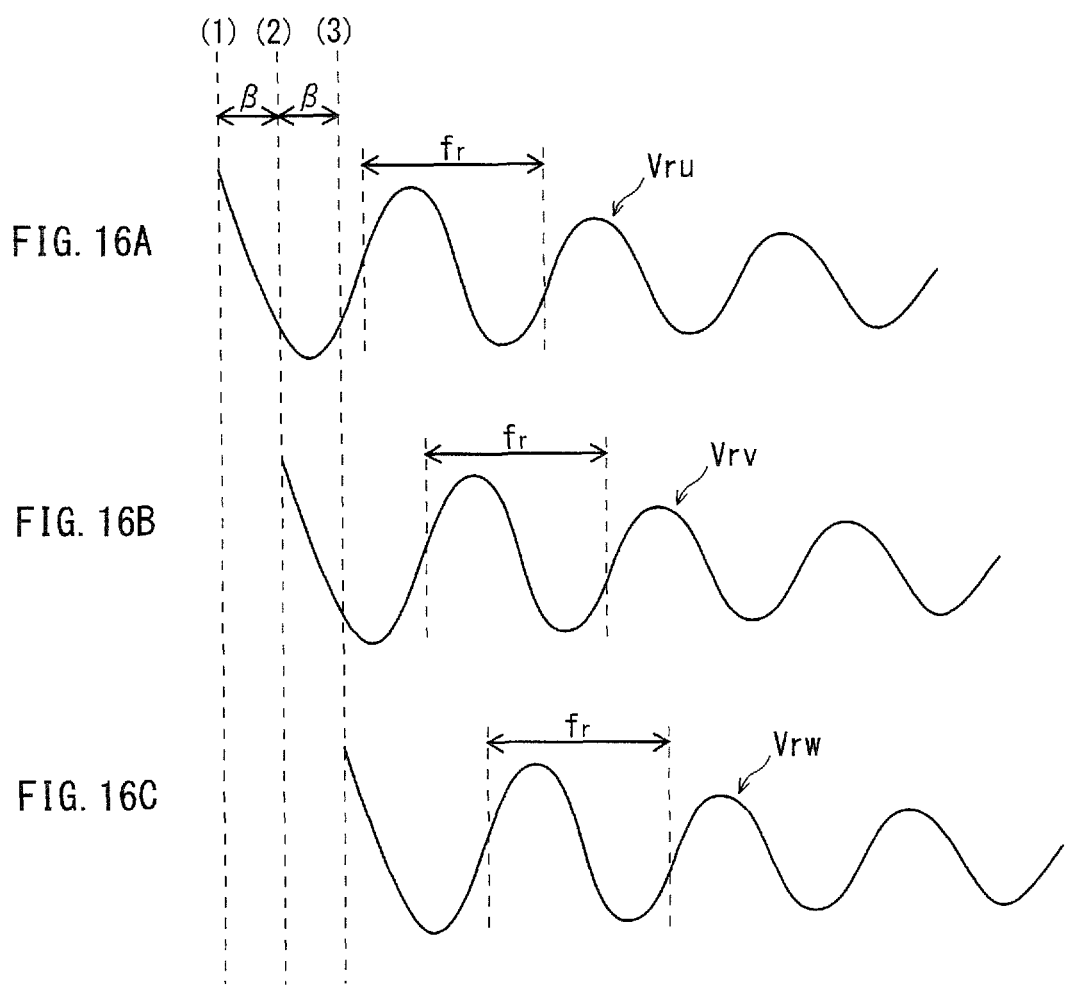
FIGS. 16A-16C are a timing chart pertaining to a modification of Embodiment 3.

FIGS. 16A-16C show a timing chart pertaining to the present modification. FIGS. 16A, 16B and 16C are enlarged views of waveforms of ringing voltages Vru, Vrv and Vrw occurring at switching devices Q31, Q33 and Q35, respectively. By setting the phase difference β to α value that corresponds with a third of the cycle of each ringing voltage, when the ringing voltages Vru, Vrv and Vrw are perfect sine waves, the sum of these ringing voltages becomes zero, and the ringing voltages are cancelled out.

In practice, since the ringing voltages Vru, Vrv and Vrw are not perfect sine waves, the sum of the ringing voltages does not become zero. However, an efficient switching noise reduction effect can still be expected.

[Embodiment 4]

Figure 17:
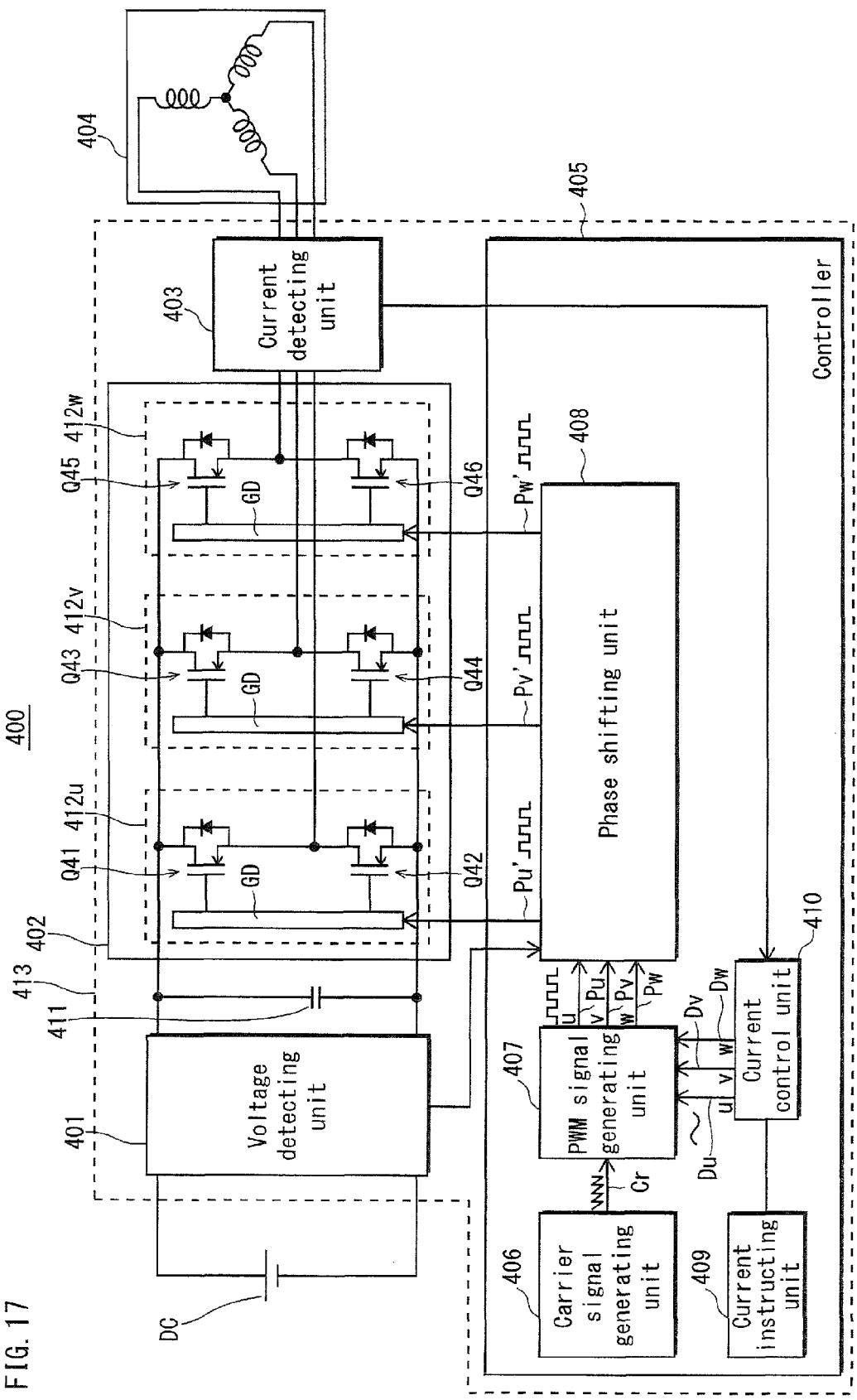
FIG. 17 shows an overall structure of a load drive system 400 provided with a power converter pertaining to Embodiment 4.

FIG. 17 shows an overall structure of a load drive system 400 provided with a power converter pertaining to Embodiment 4. Embodiment 4 is described with reference to FIG. 17.

The load drive system 400 includes a direct current power source DC, a power converter 413, and a motor 404. Although the direct current power source DC and the motor 404 are respectively the same as direct current power source DC and the motor 304 pertaining to Embodiment 3 (FIG. 11) in structure, the power converter 413 is different from the power converter 313 pertaining to Embodiment 3 in structure.

The power converter 413 includes a voltage detecting unit 401, a current detecting unit 403, a three-phase inverter 402, and a controller 405. The current detecting unit 403 and the three-phase inverter 402 are respectively the same as the current detecting unit 303 and the three-phase inverter 302 in structure. The voltage detecting unit 401 and the controller 405 are, however, different from the voltage detecting unit 301 and the controller 305 pertaining to Embodiment 3 in structure.

The controller 405 is composed of a carrier signal generating unit 406, a PWM signal generating unit 407, a phase shifting unit 408, a current instructing unit 409, and a current control unit 410. The carrier signal generating unit 406, the PWM signal generating unit 407, the current instructing unit 409, and the current control unit 410 are respectively the same as the carrier signal generating unit 306, the PWM signal generating unit 307, the current instructing unit 309, and the current control unit 310 pertaining to Embodiment 3 in structure. The phase shifting unit 408 is, however, different from the phase shifting unit 308 pertaining to Embodiment 3 in structure.

Therefore, the difference between the load drive system 400 pertaining to the present Embodiment and Embodiment 3 is that the value of voltage of direct current power source DC detected by the voltage detecting unit 401 is added as an input to the phase shifting unit 408.

According to Math 1, a frequency of a ringing voltage is determined by an output capacitance of a switching device. It is known, however, that an output capacitance decreases as the voltage between terminals of the switching device increases. The value of supply voltage increases due to noise based on a ringing voltage, which is conducted from the three-phase inverter 402 to direct current power source DC, and accordingly the frequency of the ringing voltage increases. Therefore, in order to obtain excellent noise reduction effect for a system in which the supply voltage greatly varies, it is necessary to set a value of a phase difference in the phase shifting unit to be variable.

Therefore, in the present embodiment, a value of a phase difference provided to the phase shifting unit 408 is set to be variable based on a value of the supply voltage detected by the current detecting unit 401. This can be realized by preparing beforehand values used for a phase difference that one-to-one correspond with values of the supply voltage detected by the current detecting unit 401 as database, for example.

In particular, if an output capacitance of a switching device corresponding with each value of the supply voltage is obtained, a frequency of a ringing voltage can be calculated based on Math 5. Database can then be created based on the calculated frequency by calculating values used for a phase difference in accordance with Math 2 or Math 6. The phase shifting unit 408 obtains a feedback signal based on the value of the supply voltage detected by the current detecting unit 401, reads the value used for the phase difference corresponding with the signal from the database, and performs phase shifting operations.

As described above, according to the present embodiment, it is possible to obtain efficient noise reduction effect even in a system in which the supply voltage greatly varies.

[Embodiment 5]

Figure 18:
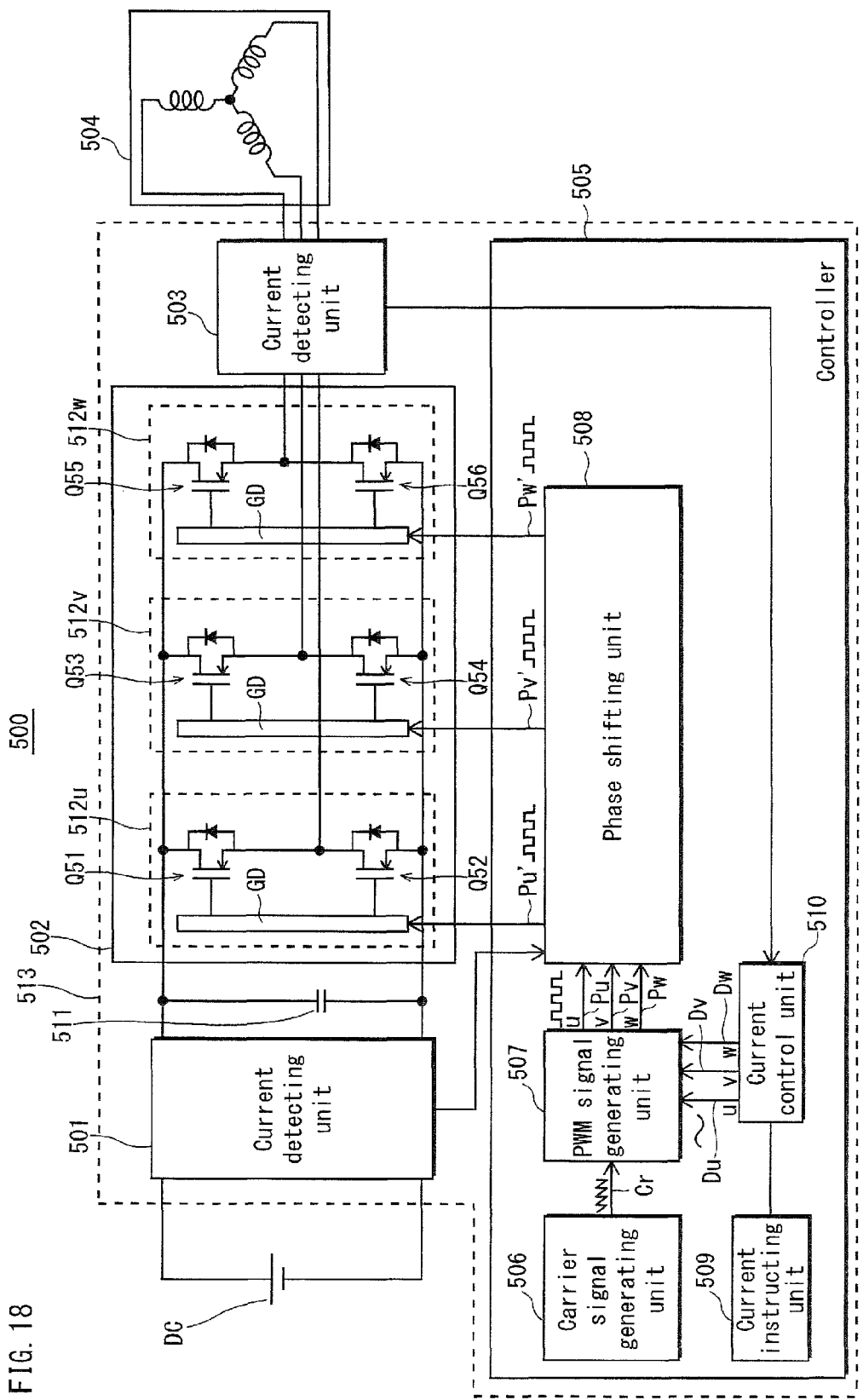
FIG. 18 shows an overall structure of a load drive system 500 provided with a power converter pertaining to Embodiment 5.

FIG. 18 shows an overall structure of a load drive system 500 provided with a power converter pertaining to Embodiment 5. Embodiment 5 is described with reference to FIG. 18.

The load drive system 500 includes a direct current power source DC, a power converter 513, and a motor 504. Although the direct current power source DC and the motor 504 are respectively the same as the direct current power source DC and the motor 404 pertaining to Embodiment 4 (FIG. 17) in structure, the power converter 513 is different from the power converter 413 pertaining to Embodiment 4 in structure.

The power converter 513 includes current detecting units 501 and 503, a three-phase inverter 502 and a controller 505. The current detecting unit 503 and the three-phase inverter 502 are respectively the same as the current detecting unit 403 and the three-phase inverter 402 pertaining to Embodiment 4 in structure. The controller 505 is, however, different from the controller 405 pertaining to Embodiment 4 in structure, and the current detecting unit 501 is not included in Embodiment 4.

The controller 505 is composed of a carrier signal generating unit 506, a PWM signal generating unit 507, a phase shifting unit 508, a current instructing unit 509, and a current control unit 510. The carrier signal generating unit 506, the PWM signal generating unit 507, the current instructing unit 509, and the current control unit 510 are respectively the same as the carrier signal generating unit 406, the PWM signal generating unit 407, the current instructing unit 409, and the current control unit 410 pertaining to Embodiment 4 in structure. The phase shifting unit 508 is, however, different from the phase shifting unit 408 pertaining to Embodiment 4 in structure.

Therefore, the difference between the load drive system 500 pertaining to the present Embodiment and Embodiment 4 is that the value of the current of direct current power source DC detected by the current detecting unit 501 is input to the phase shifting unit 508.

The current detecting unit 501 is provided with a high pass filter, and detects a component of a ringing voltage conducted from the three-phase inverter 502 to direct current power source DC. A frequency of the ringing voltage is calculated by judging zero crossing of the component of the ringing voltage, and based on the frequency of the ringing voltage, a value used for the phase difference is determined with use of Math 2 or Math 6. The phase shifting unit 508 performs phase shifting operations based on the phase difference thus determined.

As described above, according to the present embodiment, it is possible to obtain efficient noise reduction effect even in a system in which the frequency band of the ringing voltage varies.

[Embodiment 6]

Figure 19:
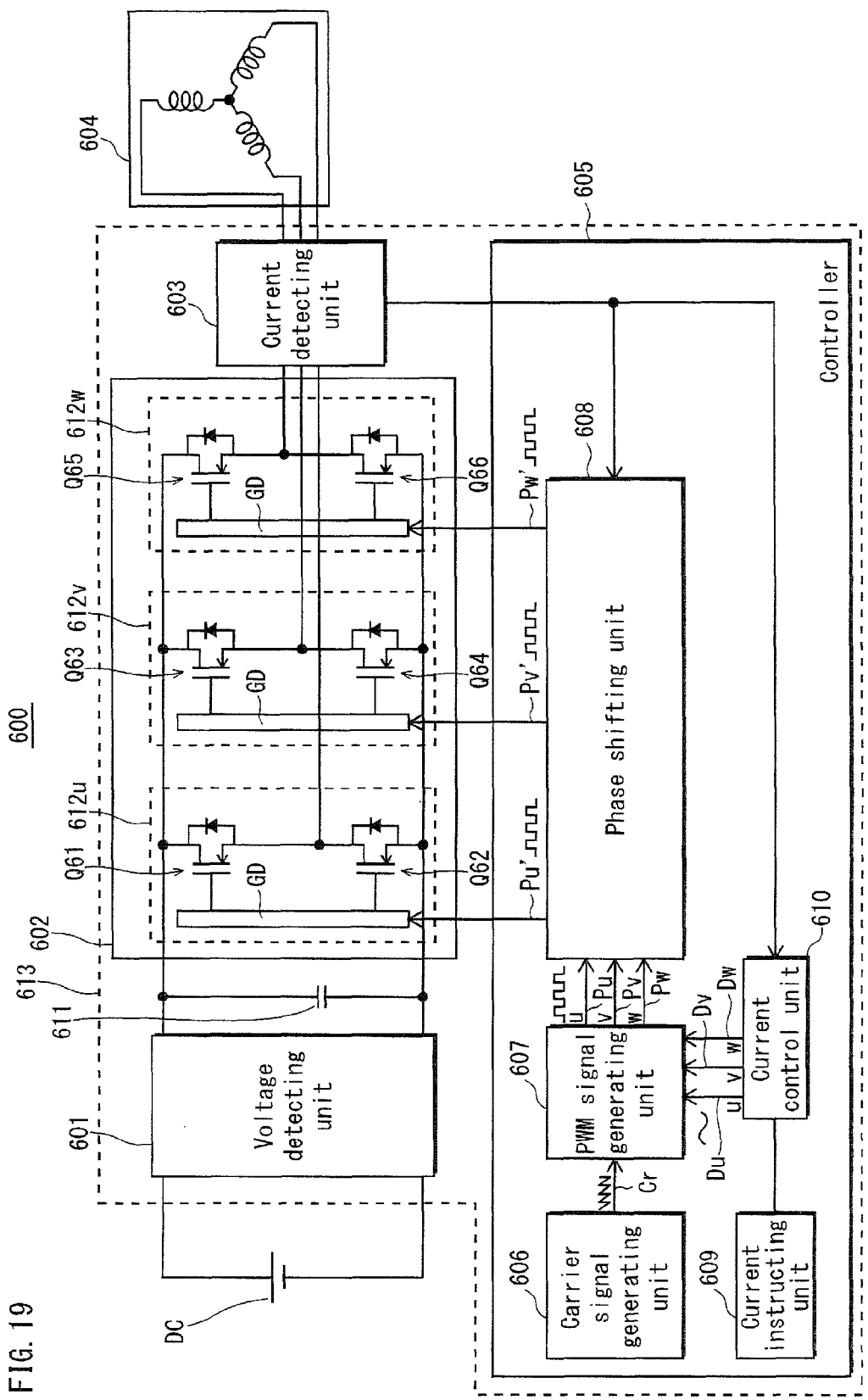
FIG. 19 shows an overall structure of a load drive system 600 provided with a power converter pertaining to Embodiment 6.

FIG. 19 shows an overall structure of a load drive system 600 provided with a power converter pertaining to Embodiment 6. Embodiment 6 is described with reference to FIG. 19.

The load drive system 600 includes a direct current power source DC, a power converter 613, and a motor 604. Although the direct current power source DC and the motor 604 are respectively the same as the direct current power source DC and the motor 504 pertaining to Embodiment 5 (FIG. 18) in structure, the power converter 613 is different from the power converter 513 pertaining to Embodiment 5 in structure.

The power converter 613 includes a voltage detecting unit 601, a current detecting unit 603, a three-phase inverter 602, and a controller 605. The voltage detecting unit 601 and the three-phase inverter 602 are respectively the same as the voltage detecting unit 301 pertaining to Embodiment 3 and the three-phase inverter 502 pertaining to Embodiment 5 in structure. The current detecting unit 603 and the controller 605 are, however, different from the voltage detecting unit 503 and the controller 505 pertaining to Embodiment 5 in structure.

The controller 605 is composed of a carrier signal generating unit 606, a PWM signal generating unit 607, a phase shifting unit 608, a current instructing unit 609, and a current control unit 610. The carrier signal generating unit 606, the PWM signal generating unit 607, the current instructing unit 609, and the current control unit 610 are respectively the same as the carrier signal generating unit 506, the PWM signal generating unit 507, the current instructing unit 509, and the current control unit 510 pertaining to Embodiment 5 in structure. The phase shifting unit 608 is, however, different from the phase shifting unit 508 pertaining to Embodiment 5 in structure.

In Embodiment 5, description is made on an example in which the current of the direct current power source DC, i.e., the value of the current input to the three-phase inverter 502 is input to the phase shifting unit 508, and the present embodiment is different from Embodiment 5 in that a value of the current output from the three-phase inverter 602 is also input to the phase shifting unit 608.

The current detecting unit 603 is provided with a high pass filter, and detects a component of a ringing voltage conducted from the three-phase inverter 602 to the motor 604. A frequency of the ringing voltage is calculated by judging zero crossing of the component of the ringing voltage, and based on the frequency of the ringing voltage, a value used for a phase difference is determined with use of Math 2 or Math 6. The phase shifting unit 608 performs phase shifting operations based on the determined phase difference.

According to the present embodiment, in a similar manner to Embodiment 5, it is possible to obtain efficient noise reduction effect even in a system in which a frequency band of a ringing voltage varies. Further, in the present embodiment, a value of current output from the three-phase inverter 602 is detected, and it is therefore possible to detect a value of current output from each of the U-phase, the V-phase and the W-phase, unlike Embodiment 5. Accordingly, the present embodiment is effective when frequencies of ringing voltages are different among the U-phase, the V-phase and the W-phase.

[Embodiment 7]

In Embodiments 1-6, description is made on a PWM method for changing current flow rate of each of switching devices constituting the three-phase inverter to control output voltage. The present invention is, however, not limited to this. In the present embodiment, description is made on a power converter using a driving method, i.e., so-called Pulse Amplitude Modulation (PAM). According to this method, a chopper circuit is connected between a direct current power source and a three-phase inverter, and voltage input to a motor is variably controlled by setting the current output from the chopper circuit to be variable.

Figure 20:
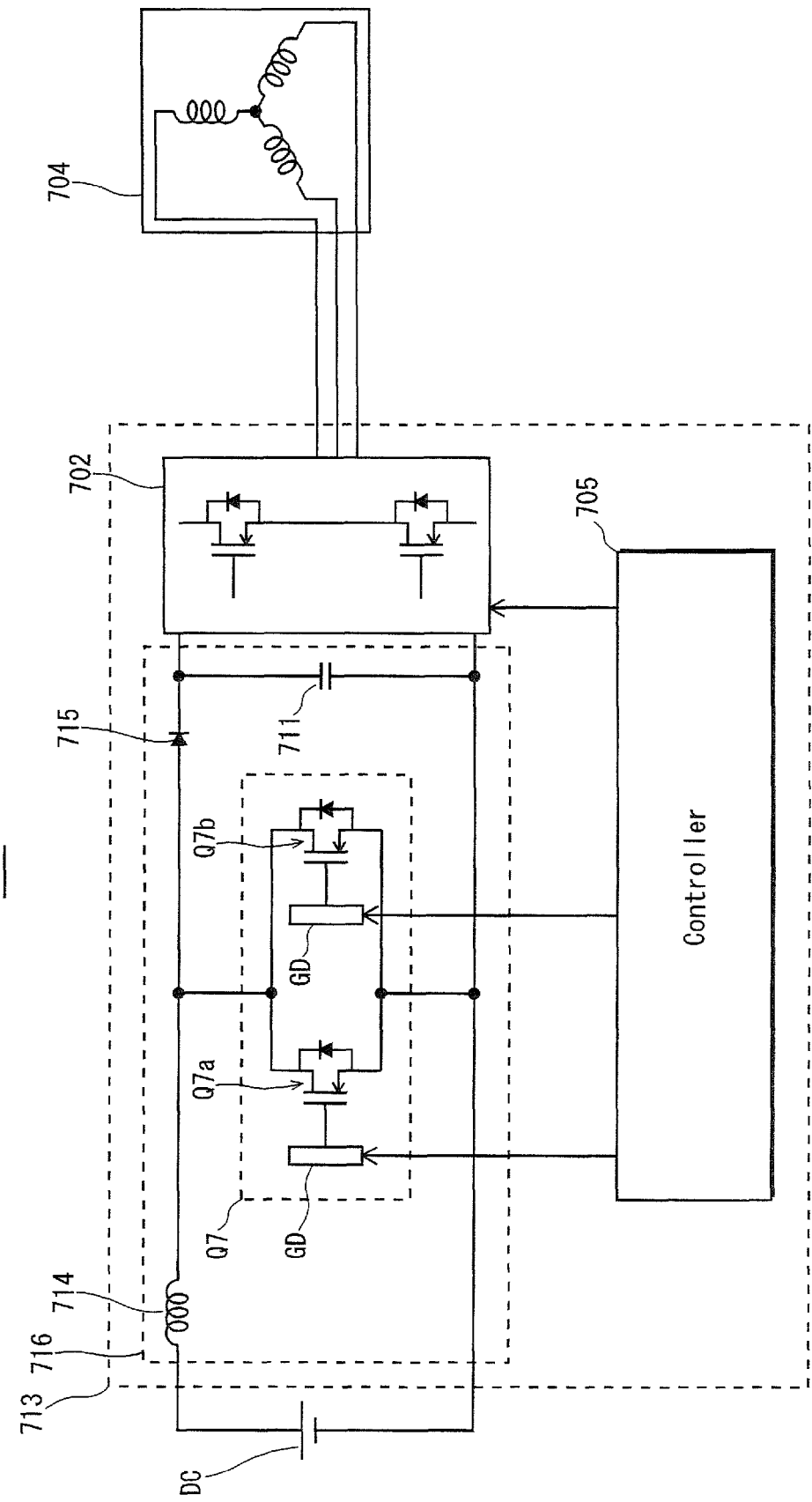
FIG. 20 shows an overall structure of a load drive system 700 provided with a power converter pertaining to Embodiment 7.

FIG. 20 shows an overall structure of a load drive system 700 provided with a power converter pertaining to the present embodiment.

The load drive system 700 includes a direct current power source DC, a power converter 713, and a motor 704.

The direct current power source DC is a direct current power source that obtains direct current by rectifying current from a commercial current power source, or a battery type direct current power source.

The power converter 713 is composed of a boost chopper circuit 716, a three-phase inverter 702, and a controller 705, converts current supplied from direct current power source DC into the three-phase alternating current composed of the U-phase, the V-phase and the W-phase, and supplies the three-phase alternating current to the motor 704.

The boost chopper circuit 716 is a circuit that boosts voltage of direct current power source DC, and outputs the boosted direct voltage to the three-phase inverter 702. The boost chopper circuit 716 has a general structure in which an inductor 714, a diode 715, a switching device group Q7, and a capacitor 711 are included. The switching device group Q7 is, in a similar manner to the switching device groups in Embodiments 1 and 2, aimed to increase the amount of current flowing through the switching device group Q7, and composed of switching devices Q7a and Q7b connected in parallel. To gate terminals of the switching devices Q7a and Q7b, gate drive circuits GDs are connected.

The three-phase inverter 702 converts current output from the boost chopper circuit 716 to three-phase alternating current, and supplies the three-phase alternating current to the motor 704. Although the detailed structure of the three-phase inverter 702 is not illustrated, the three-phase inverter 702 is composed of a three-phase bridge in a similar manner to the three-phase inverter 302 pertaining to Embodiment 3.

The controller 705 generates PWM signals that are instruction signals transmitted to the gate drive circuits GDs. These PWM signals are output to gate terminals of the switching devices Q7a and Q7b via the gate drive circuits GDs to individually control the switching devices. Further, the controller 705 generates an instruction signal transmitted to the three-phase inverter 702.

The motor 704 is a three-phase alternating motor composed of a three-phase coil receiving the three-phase alternating current from the three-phase inverter 702.

Here, when it is assumed that the switching devices Q7a and Q7b connected in parallel operate in synchronization with each other, ringing voltages occurring due to the switching operations are superimposed and accordingly switching noise increases.

So as to solve this, the controller 705 pertaining to the present embodiment generates PWM signals for controlling the switching devices Q7a and Q7 to perform operations at different timings such that ringing voltages generated by the switching devices Q7a and Q7b are cancelled out. The specific operation of the controller 705 for generating these PWM signals is the same as that of the controller 105 pertaining to Embodiment 1, and the explanation thereof is therefore omitted.

As described above, a power converter using the PAM method can effectively reduce switching noise.

Note that although the switching device group Q7 is composed of two switching devices in FIG. 20, the number of switching devices is not limited to this and three switching devices may be used. In that case, the structures of Embodiment 2 and the modification thereof can be applied.

[Embodiment 8]

In the present embodiment, description is made on an example in which the present invention is applied to a three-phase converter.

Figure 21:
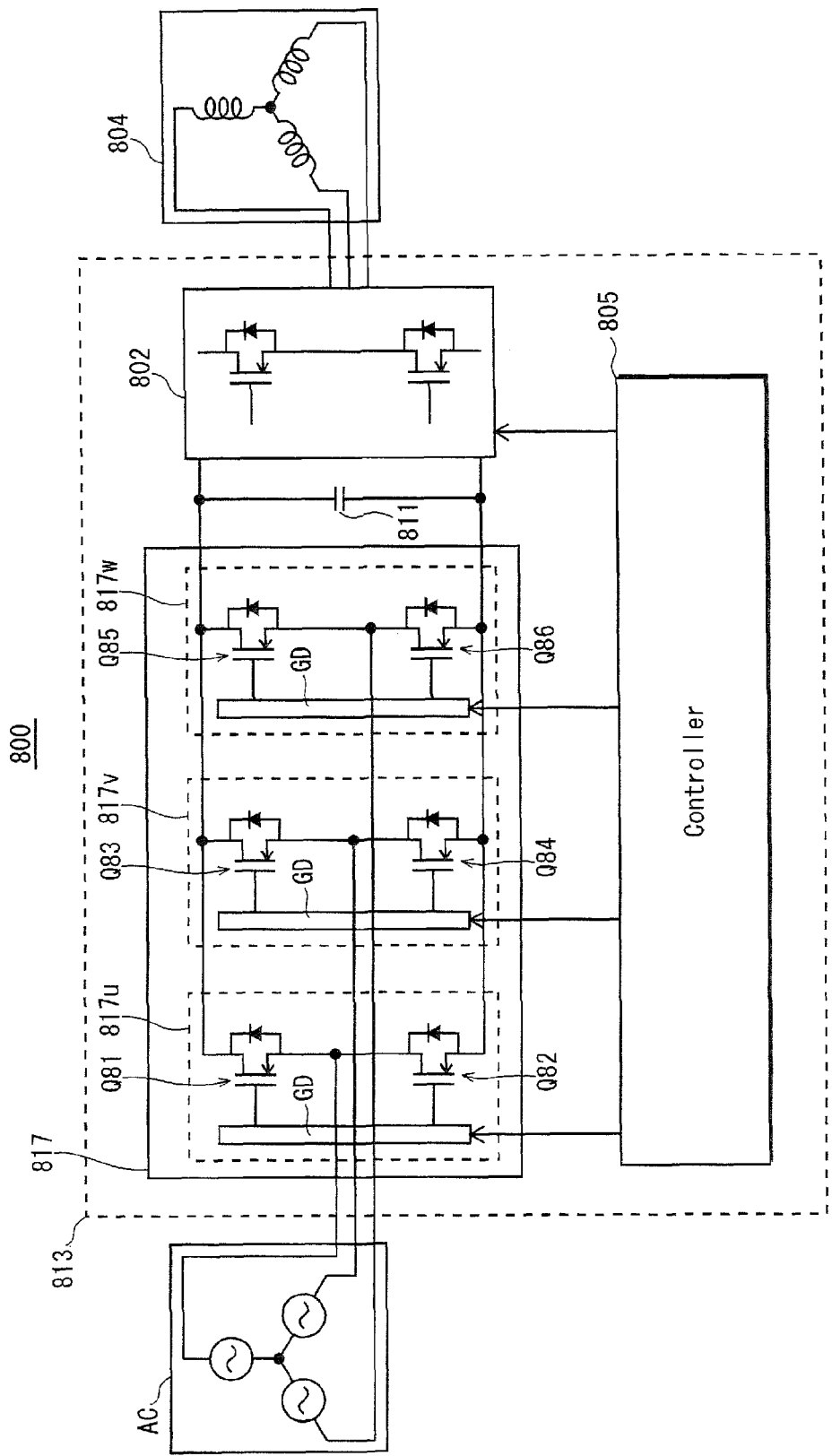
FIG. 21 shows an overall structure of a load drive system 800 provided with a power converter pertaining to Embodiment 8.

FIG. 21 shows an overall structure of a load drive system 800 provided with a power converter pertaining to the present embodiment.

As shown in FIG. 21, the load drive system 800 includes a power converter using converter-inverter method, and is composed of a three-phase alternating current power source AC, a power converter 813 and a motor 804.

The three-phase alternating current power source AC outputs the alternate current composed of U-phase, V-phase and W-phase whose phases are out of phase by 120°, and in electrical angle by $2\pi/3$ radians with respect to one another.

The power converter 813 is composed of a three-phase converter 817, a three-phase inverter 802, a controller 805 and a capacitor 811. The power converter 813 rectifies the three-phase alternating current supplied from the three-phase alternating current power source AC to the direct current, converts again the direct current to the three-phase alternating current composed of the U-phase, the V-phase and the W-phase, and supplies the current to the motor 804.

The three-phase converter 817 rectifies the three-phase alternating current supplied from the three-phase alternating current power source AC to the direct current, and is composed of a three-phase bridge composed of a U-phase arm 817u, a V-phase arm 817v and a W-phase arm 817w. The U-phase arm 817u is composed of a high-side switching device Q81 and a low-side switching device Q82 that are connected in parallel. Also, the V-phase arm 817v is composed of a high-side switching device Q83 and a low-side switching device Q84 that are connected in parallel, and the W-phase arm 817w is composed of a high-side switching device Q85 and a low-side switching device Q86 that are connected in parallel. To gate terminals of the switching devices Q81-Q86, gate drive circuits GDs are connected. The three-phase inverter 802 converts the direct current output from the three-phase converter 817 to the three-phase alternating current, and supplies the three-phase alternating current to the motor 804. Although the detailed structure of the three-phase inverter 802 is not illustrated, the three-phase inverter 802 is composed of a three-phase bridge in a similar manner to the three-phase inverter 302 pertaining to Embodiment 3.

The controller 805 generates PWM signals that are instruction signals transmitted to the gate drive circuits GDs. These PWM signals are output to gate terminals of switching devices Q81-Q86 via the gate drive circuits GDs to individually control the switching devices. Further, the controller 805 generates an instruction signal transmitted to the three-phase inverter 802.

The capacitor 811 is provided to reduce the voltage change within the power converter 813.

The controller 805 generates PWM signals for the U-phase, the V-phase and the W-phase by comparing a carrier signal with control instruction signals in a similar manner to Embodiments 1-6. However, as described in Embodiment 3, when using a carrier signal repeating gradually transitioning from a first level to a second level and then resetting to the first level from the second level such as a sawtooth wave, there is a problem that noise increases. This is because superimposition of ringing voltages caused when switching devices of the U-phase, the V-phase and the W-phase perform switching operations at the same time, which is described in Embodiment 3, also occurs at the three-phase converter 817.

So as to solve this, the controller 805 pertaining to the present embodiment generates PWM signals whose timings of operations of the switching devices Q81, Q82 and Q83, and Q84, Q85 and Q86 are misaligned with one another such that ringing voltages generated by the switching devices of the U-phase, the V-phase and the W-phase are cancelled out. The specific operation of the controller 805 for generating these PWM signals is the same as that of the controller 305 pertaining to Embodiment 3, and the explanation thereof is therefore omitted.

As described above, a power converter using converter-inverter method can effectively reduce switching noise.

This concludes the description of Embodiments 1-8. The present invention is, however, not limited to the embodiments above. For example, the following modifications can be made.

[Modifications]

(1) In Embodiments 1 and 2 and the modifications thereof, the principle of reduction of switching noise is described by taking only the high-side switching device group of the U-phase arm. However, the same explanation can be made on the low-side switching device group by reversing ON and OFF. Each switching device group of the V-phase arm and the W-phase arm can be explained by the same principle as that of the U-phase arm.

In Embodiment 3 and the modification thereof, the principle of reduction of switching noise is described by taking only the high-side switching device group. However, the same explanation can be made on the low-side switching device group by reversing ON and OFF.

(2) In Embodiments 1, 2 and 3, the phase difference α is a half of the cycle of a ringing voltage, i.e., 0.5 cycles. If such a phase difference α corresponds with a delay of 0.5×N (N is a positive odd number) such as 1.5 cycles and 2.5 cycles, it is possible to cancel the ringing voltages out, and to achieve noise reduction effect. In this case, however, the ringing voltages of a period of a delayed cycle remain without being cancelled, and accordingly, noise reduction effect is low compared to the case where the phase difference α is 0.5 cycles. Note that although in Embodiment 1, for example, a timing of a switching operation of the switching device Q11b is delayed with respect to the switching device Q11a, the same noise reduction effect can be achieved by advancing a timing of a switching operation of the switching device Q11b with respect to the switching device Q11a.

(3) Although in Embodiments 1, 2 and 3 and the modifications thereof, the phase difference α corresponds with a half of the cycle of the ringing voltage and the phase difference β corresponds with a third of the cycle of the ringing voltage, these phase differences α and β do not have to be exactly a half of the cycle and a third of the cycle, respectively. They only have to be approximately a half of the cycle and approximately a third of the cycle. Here, "approximately a half of the cycle" and "approximately a third of the cycle" may vary within the range in which a noise level becomes at or below a half of the noise level of the conventional structure when the noise reduction effect is being exerted to cancel ringing voltages. Further, "conventional structure" mentioned here is, as shown in FIG. 23, a structure in which switching devices connected in parallel operate in synchronization with each other. A specific Example is described with reference to FIG. 22.

Figure 22:
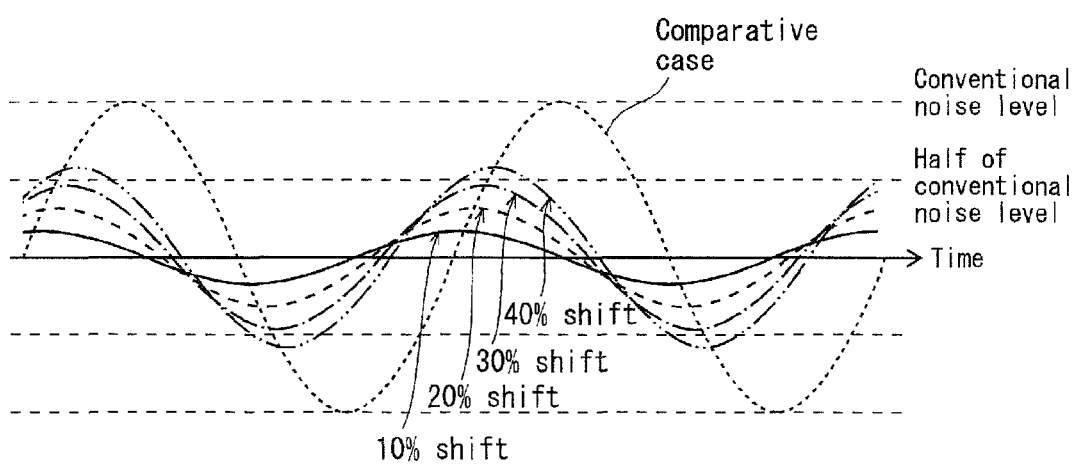
FIG. 22 shows a result of noise level simulation performed in the case where a waveform of a ringing voltage is assumed to be a perfect sine wave.
Figure 23:
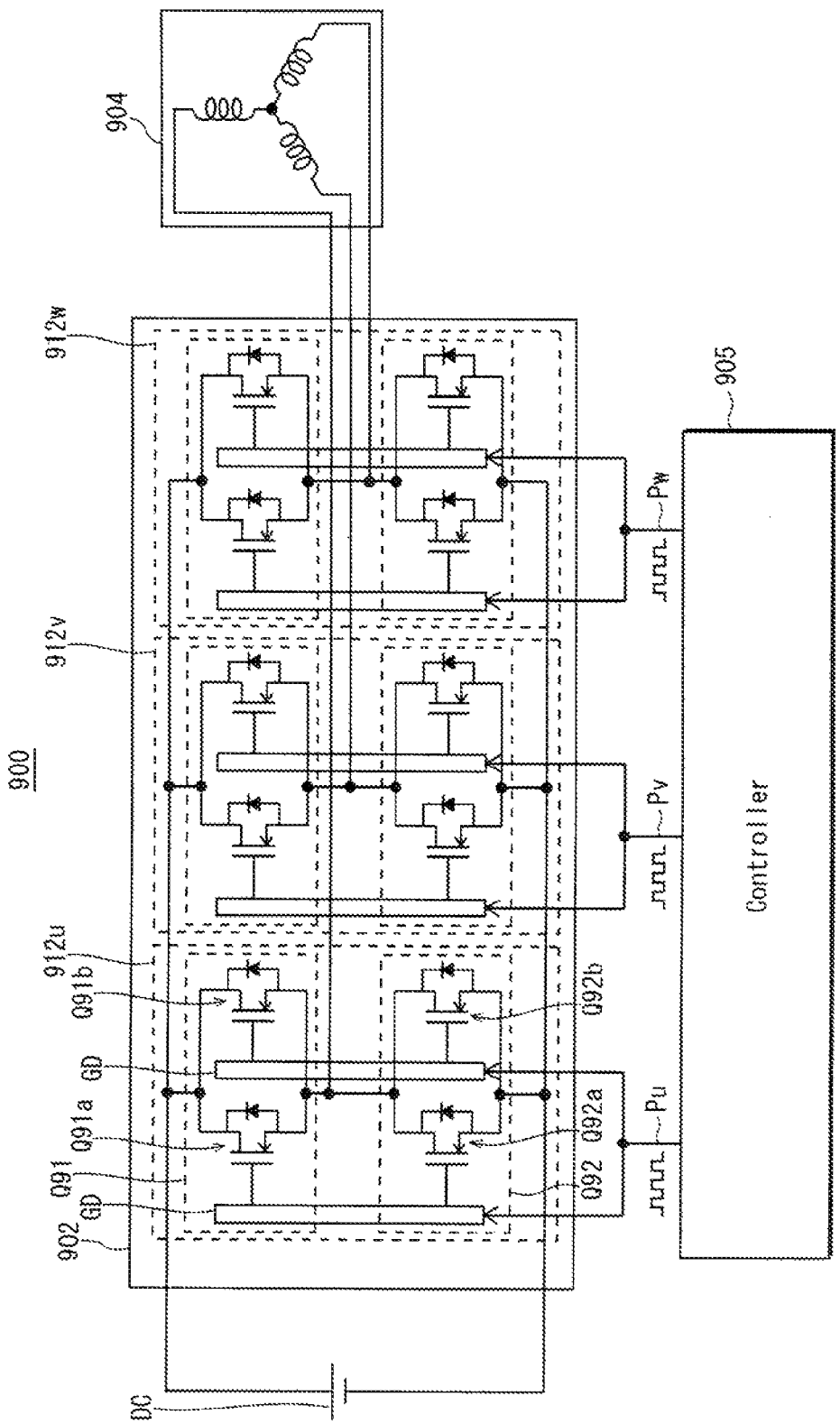
FIG. 23 shows an overall structure of a load drive system 900 provided with a power converter pertaining to conventional art.

FIG. 22 shows simulated noise level of the case where a waveform of a ringing voltage is assumed to be a perfect sine wave. The simulation was performed by using the second sine wave whose amplitude and frequency are the same as those of the first sine wave, and whose phase is out of phase by 120° (reversed phase) with respect to the first sine wave. As the phase of second sine wave is being gradually changed by 10%(18°) at a time, both sine waves were added up.

In FIG. 22, the second sine waves whose phases are out of phase by 10% (18°), 20% (36°), 30% (54°) and 40% (72°) with respect to the first sine wave are respectively illustrated as "10% shift" (solid line), "20% shift" (dotted line), "30% shift" (single-dashed line) and "40% shift" (double-dashed line). As a comparative case, noise level of the conventional structure is indicated by a broken line. As a matter of course, when the phase of second sine wave is not out of phase, the sum of the first sine wave and the second sine wave becomes zero level.

As shown in FIG. 22, when the phase of second sine wave is out of phase by 30%, noise level is smaller than a half of the noise level of the conventional structure. On the other hand, when the phase of second sine wave is out of phase by 40%, noise level is greater than the noise level of a half of the conventional structure. Accordingly, it is proved that the noise level is a half of the noise level of the conventional structure when the phase of second sine wave is out of phase approximately 35% (63°).

Therefore, when two switching devices are connected in parallel and it is assumed that a ringing voltage generated by each switching device is a perfect sine wave, the range of "approximately a half of the cycle" ranges from 117° to 243°.

(4) In Embodiments 1 and 2 and the modifications thereof, it is desirable that a period in which switching devices connected in parallel transition from the ON state to the OFF state and a period in which the switching devices transition from the OFF state to the ON state are the same. To be specific, for example, it is desirable that a period in which the switching device Q11a pertaining to Embodiment 1 transitions from the ON state to the OFF state and a period in which the switching device Q11b transitions from the ON state to the OFF state are the same. This is because even if the switching device Q11b is out of phase by a predetermined phase difference with respect to the switching device Q11a during operation such that ringing voltages occurring between terminals of the switching devices are cancelled out, a difference between transition periods of the switching devices reduces ringing voltages to be cancelled and decreases noise reduction effect.

Further, in Embodiment 3 and the modification thereof, it is also desirable that a period in which switching devices Q31, Q33 and Q35 transition from the ON state to the OFF state and a period in which the switching devices transition from the OFF state to the ON state are the same.

(5) Normally, in order to prevent a short circuit that occurs when a high-side switching device group and a low-side switching device group of the same phase switch ON at the same time, a dead time is provided. In Embodiment 1, the switching devices Q11a and Q11b transition from the ON state to the OFF state, and after a predetermined period, the switching devices Q12a and Q12b then transitions from the OFF state to the ON state. This predetermined period is referred to as a dead time. It is desirable that a dead time provided to the switching device Q12a and a dead time provided to the switching device Q12b are the same. By doing this, it is possible to prevent noise reduction effect from reducing due to a difference of set dead times.

(6) The phase shift circuit pertaining to the above embodiments may use Field-Programmable Gate Array (FPGA). Hereinafter, explanation is provided by using Embodiment 3 (FIG. 11) as an example.

The FPGA can operate at up to approximately 200 MHz clock (approximately 5 nsec). It is assumed that the switching device Q31 is a capacitance and the switching device Q32 is a resistance. If it is assumed that the sum of parasitic inductances included in a closed circuit connecting the switching devices Q31 and Q32 and the capacitor 311 is 50 nH and an output capacitance of the switching device Q31 is 120 pF, a frequency f of a ringing voltage is approximately 65 MHz base on Math 1. Based on Math 2, α is then calculated as approximately 7.7 nsec, and it is possible to perform control like Embodiment 3 by using FPGA.

Note that as a matter of course, it is possible to use a gate array other than FPGA as a phase shift circuit.

(7) The noise reduction method of the power converter pertaining to the present invention is more effective when wide bandgap semiconductors such as SiC or GaN, which have been focused on in recent years, are applied to switching devices. The reason for this is described below.

When these wide-band gap semiconductors are applied to switching devices, it is possible to increase switching frequency, and it is expected that the size of a current power source device can be reduced. In this case, since voltage between terminals of a switching device is required to change faster in accordance with increase of the switching frequency, it is thought that a current changing rate will become at or beyond that of a Si device that is currently used. Further, if the size of a current power source device is reduced, intervals between various circuit components become small and parasitic capacitance components increase. Accordingly, when the wide bandgap semiconductors are applied to switching devices, due to increase of the current changing rate and parasitic capacitance components, great ringing voltages might be generated by the switching devices. It is expected that this might be a big problem in the future.

According to the power converter pertaining to the present Embodiment, however, it is possible to reduce the great ringing voltages in question within closed circuits that connect their respective switching devices and the capacitor and that are the source of the ringing voltages. In other words, it can be said that the power converter pertaining to the present Embodiment is more effective in reducing noise as a switching device having a higher switching frequency is used.

Further, when the above FPGA is used as a phase shift circuit, it is desirable to use a wide bandgap semiconductor as a switching device. The details thereof is explained by taking Embodiment 3 (FIG. 11) and the modification thereof as examples, and comparing the case in which Si devices that are currently used are employed as switching devices Q31-Q36 and the case in which devices composed of wide bandgap semiconductors are employed as the switching devices Q31-Q36.

First, description is made on the case where Si-IGBT that is a Si device is employed. It is assumed that the switching device Q31 is a capacitance and the switching device Q32 is a resistance, in a similar manner to Modification (6). If it is assumed that a parasitic inductance included in a closed circuit connecting the switching devices Q31 and Q32 and the capacitor 311 is 50 nH and an output capacitance of the switching device Q31 is 25 pF, a frequency f of a ringing voltage is approximately 142 MHz base on Math 1. Accordingly, α in Embodiment 3 is calculated as approximately 3.5 nsec in accordance with Math 2, and β in the modification of Embodiment 3 is calculated as approximately 2.3 nsec based on Math 6. As described above, FPGA can only operate at up to approximately 5 nsec clock. When Si-IGBT is used, it is therefore impossible to perform control like Embodiment 3 and the modification thereof.

In contrast, when SiC-MOSFET is employed as a device using a wide bandgap semiconductor and if it is assumed that the sum of parasitic inductances included in the above closed circuit is 50 nH and an output capacitance of the switching device Q31 is 250 pF, a frequency f of a ringing voltage is approximately 45 MHz based on Math 1. The ringing voltage when the wide bandgap semiconductor is employed is approximately a third compared with the case where a Si device is employed. Accordingly, α in Embodiment 3 is calculated as approximately 11.1 nsec based on Math 2, and β in the modification of Embodiment 3 is calculated as approximately 7.4 nsec based on Math 6. As a result, when the SiC-MOSFET is employed, it is possible to perform control by using the FPGA like Embodiment 3 and the modification thereof.

(8) In Embodiments 1 and 2 and the modifications thereof, description is made on an example in which a carrier signal is a sawtooth wave. The carrier signal is, however, not limited to a sawtooth wave. When a triangular wave or the like is used as a carrier signal, the same noise reduction effect can be achieved.

(9) In Embodiments 1-6, description is made on an example in which the capacitor is included in the three-phase inverter. The capacitor may not be included in the three-phase inverter.

(10) The "predetermined phase difference" provided in the phase shifting unit may be the same value for each switching device group (or for each phase arm), or may be different values. The different values are effective when frequencies of ringing voltages occurring at switching device groups (or phase arms) are different.

(11) In Embodiments 1 and 2, the number of switching devices connected in parallel in one switching device group is two or three. By applying the structure of the above embodiments, it is possible to handle the case where more than four switching devices are connected in parallel.

For example, when four switching devices are connected in parallel, by causing the first switching device and the second switching device to operate in synchronization with each other and causing the third switching device and the fourth switching device to operate in synchronization with each other, it is possible to cancel out a ringing voltage generated by the first switching device and a ringing voltage generated by the third switching device. The same is true for the second switching device and the fourth switching device.

Further, when five switching devices are connected in parallel, the structure of Embodiment 1 is applied to the first and second switching devices, and the structure of Embodiment 2 is applied to the third, fourth and fifth switching devices. Then, switching noise can be reduced.

(12) In Embodiments 4-6, by using a noise detecting unit for detecting noise based on ringing voltages, effective noise reduction effect can be achieved even in the system in which a frequency band of a ringing voltage varies. To be specific, a noise detecting unit pertaining to Embodiment 4 corresponds with the voltage detecting unit 401, a noise detecting unit pertaining to Embodiment 5 corresponds with the current detecting unit 501, and a noise detecting unit pertaining to Embodiment 6 corresponds with the current detecting unit 603.

A noise detecting unit is not limited to the above structure. For example, the above effect can be achieved by using the structure in which a value of voltage that is output from the three-phase inverter is detected. Further, when using circuits such as the voltage detecting unit 401 and the current detecting units 501 and 603 that are included in a general power converter, a separate noise detecting unit is not provided, and accordingly a manufacturing cost and a mounted volume can be reduced. As a matter of course, the structure in which a separate noise detecting unit is provided is possible.

(13) In order to enhance the effect of cancelling ringing voltages out, it is desirable to set the lengths of wires to the same, each wire connecting the capacitor and a corresponding one of the switching devices that generate ringing voltages desired to be cancelled out. For example, in Embodiment 1 (FIG. 1), it is desirable that the length of a wire connecting the capacitor 111 and the switching device Q11a and the length of a wire connecting the capacitor 111 and the switching device Q11b are set to the same. By doing this, parasitic inductances included in these wires can be approximately the same, and accordingly frequencies of ringing voltages can be approximately the same. Accordingly, it is possible to enhance the effect of cancelling the ringing voltages out.

(14) Each figure merely schematically shows the layout configuration only to make the present invention understandable, and the present invention is not limited to the examples in the figures. Furthermore, for the sake of understandability, some parts in the figures are omitted.

(15) The above embodiments and the above modifications are merely preferable examples, and the present invention is not limited to these examples at all. Furthermore, the structures described in the embodiments and the modifications may be appropriately combined.

(16) Even in a case where each component has the same difference in the characteristics (e.g., in a case where it takes the same period for switching devices to transition from the ON state to the OFF state, and to transition from the OFF state to the ON state), any tolerance within a scope of manufacturing tolerance is of course acceptable.

INDUSTRIAL APPLICABILITY

The present invention is preferably applied to a power converter that requires low noise characteristics.

REFERENCE SIGNS LIST 100, 100A, 300, 400, 500, 600, 700, 800, 900 load drive system
101, 301, 401, 601 voltage detecting unit
102, 202, 302, 402, 502, 602, 702, 802, 902 three-phase inverter
103, 303, 403, 501, 503, 603 current detecting unit
104, 304, 404, 504, 604, 704, 804, 904 motor
105, 105A, 305, 405, 505, 605, 705, 805, 905 controller
106 106A, 306, 406, 506, 606 carrier signal generating unit
107 107A, 307, 407, 507, 607 PWM signal generating unit
108, 208, 308, 408, 508, 608 phase shifting unit
108u U-phase shifting unit
108v V-phase shifting unit
108w W-phase shifting unit
109, 309, 409, 509, 609 current instructing unit
110, 310, 410, 510, 610 current control unit
111, 311, 411, 511, 611, 711, 811 capacitor (smoothing capacitor)
112u, 212u, 312u, 412u, 512u, 612u, 817u, 912u U-phase arm
112v, 212v, 312v, 412v, 512v, 612v, 817v, 912v V-phase arm
112w, 212w, 312w, 412w, 512w, 612w, 817w, 912w W-phase arm
113, 113A, 313, 413, 513, 613, 713, 813 power converter
714 inductor
715 diode
716 boost chopper circuit
817 three-phase converter
318 line impedance stabilization network (LISN)
319 spectrum analyzer
320 load
321 pulse generator
322u U-phase voltage detecting unit
322v V-phase voltage detecting unit
DC direct current power source
AC three-phase alternating current power source
GD gate drive circuit
Q11, Q13, Q15, Q21, Q23, Q25, Q91 high-side switching device group
Q12, Q14, Q16, Q22, Q24, Q26, Q92 low-side switching device group
Q7 switching device group
Q31, Q33, Q35, Q41, Q43, Q45, Q51, Q53, Q55, Q61, Q63, Q65, Q81, Q83, Q85 high-side switching device
Q32, Q34, Q36, Q42, Q44, Q46, Q52, Q54, Q56, Q62, Q64, Q66, Q82, Q84, Q86 low-side switching device
Q11a-Q16a, Q11b-Q16b, Q21a-Q26a, Q21b-Q26b, Q21c-Q26c, Q7a, Q7b, Q91a, Q92a, Q91b, Q92b switching device
R1, R2 resistance
C1, C2 capacitor
Lcap_1, Lcap_2, Lw_1, Lw_2, Lm_1-Lm_4 parasitic inductance
Coss_1, Coss_2 output capacitance
Vra, Vrb, Vrc, Vru, Vrv, Vrw ringing voltage
Cr, Cra, Crb carrier signal
Du U-phase control instruction signal
Dv V-phase control instruction signal
Dw W-phase control instruction signal
Pu, Pu', Pua, Pub, Puc U-phase PWM signal
Pv, Pv', Pva, Pvb, Pvc V-phase PWM signal
Pw, Pw', Pwa, Pwb, Pwc W-phase PWM signal

The invention claimed is:

1. A power converter comprising:
a capacitor;
is plurality of switching devices connected to the capacitor in parallel; and
a controller configured to control each switching device individually to perform switching operations, wherein
the plurality of switching devices are connected to one another in parallel,
each switching device forms at closed circuit together with the capacitor, and
the controller controls, for at least two closed circuits, the plurality of switching devices included therein to perform the switching operations of switching ON or OFF at different timings such that the at least two closed circuits mutually cancel ringing voltages occurring therein, each ringing voltage occurring due to the switching operations performed by a corresponding switching device and having a frequency defined by an inductance of a corresponding closed circuit and an output capacity of a switching device included in the corresponding closed circuit.

2. The power converter of claim 1, wherein the controller controls the plurality of switching devices in the at least two closed circuits to perform the switching operations at the differing timings differing from each other by approximately a. half of a cycle of each ringing voltage.

3. The power converter of claim 1, wherein
the plurality of switching devices forming the closed circuits include a first switching device, a second switching device and a third switching device,
the first, second. and third switching devices are connected to one another in parallel, and
the controller
controls the second switching device to perform the switching operations at as first timing later than the switching operations performed by the first switching device by approximately ⅓ of a cycle of each ringing voltage, and
controls the third switching device to perform the switching operations at a second timing later than the switching operations performed by the first switching device by approximately ⅔ of the cycle of each ringing voltage.

4. The power converter of claim 1, wherein
the controller includes:
a carrier signal generating unit configured to generate a carrier signal;
a control instruction signal generating unit configured to generate a control instruction signal;
a pulse width modulation signal generating unit configured to generate a pulse width modulation signal based on a comparison of the carrier signal with the control instruction signal, the pulse width modulation signal being for controlling a timing at which each switching device performs the switching operations; and
a phase shifting unit configured to perform phase shifting on the pulse width modulation signal to generate pulse width modulation signals corresponding one-to-one with the plurality of switching devices such that the plurality of switching devices in the at least two closed circuits perform the switching operations at the different timings.

5. The power converter of claim 4, wherein
the phase shifting unit is composed of a field programmable gate array, and
each switching device is composed of a wide. bandgap semiconductor.

6. The power converter of claim 1, wherein
the controller includes:
a carrier signal generating unit configured to perform phase shilling on a carrier signal to generate carrier signals corresponding one-to-one with the plurality of switching devices such that the plurality of switching devices in the at least two closed circuits perform the switching operations at the different timings;
a control instruction signal generating unit configured to generate a control instruction signal; and
a pulse width modulation signal generating unit configured to generate pulse width modulation signals corresponding one-to-one with the plurality of switching devices based on comparisons of the carrier signals with the control instruction signal, each pulse width modulation signal being for controlling a timing at which a corresponding switching device performs the switching operations.

7. The power converter of claim 1, wherein
the inductance of the corresponding closed circuit includes:
a first inductance, Lm, of a first wire included in a switching device of the corresponding closed, circuit;
a second inductance, Lcap, of the capacitor; and
a third inductance, Lw, of a second wire connecting the switching device of the corresponding closed circuit and the capacitor, and
a frequency, $f_r$, of a ringing voltage occurring at the corresponding closed circuit is defined $$f_r = \frac{1}{2\pi\sqrt{(Lcap + Lw + Lm) \times (Coss)}}$$

based on an output capacity, Coss, of one of the plurality of switching devices, the Lm, the Leap and the Lw.

8. The power converter of claim 7, wherein
an inverse of the, frequency, $1/f_r$ is a period of a cycle of the ringing voltage, and
the controller controls the plurality of switching devices included in the at least two closed circuits to perform the switching operations at the different timings differing from each Other by approximately a half of the cycle of each ringing voltage.

9. The power converter of Claim 7, wherein
the plurality of switching devices forming the closed circuits include a first switching device, a second switching device and a third switching device,
an inverse of the frequency, $1/f_r$ is a period of a cycle of the ringing voltage, and
the controller
controls the second switching, device to perform the switching operations at a first timing later than the switching operations performed by the first switching device by approximately ⅓ of the cycle of each ringing voltage, and
controls the third switching device to perform the switching operations at a second timing later than the switching operations performed by the first switching device by approximately ⅔ of the cycle of each ringing voltage.

10. The power converter of claim 1, further comprising:
a noise detecting unit configured to detect noise based on each ringing voltage, wherein
in accordance with a result of detection performed by the noise detecting unit, a difference between the different timings at which the plurality of switching devices perform the switching operations is variable.

11. The power converter of claim 10, wherein the noise detecting unit detects the noise at an input terminal of the power converter.

12. The power converter of claim 10, wherein the noise detecting unit detects the noise at an output terminal of the power converter.

13. The power converter of claim 1, wherein
each switching device transitions from an ON state to an OFF state in a first period that is the same as a second period during which each switching device transitions from the OFF state to the ON state.

14. The power converter of claim 1, wherein
each switching device is composed of a wide bandgap semiconductor.

15. The power converter of claim 1, further comprising;
a voltage detecting unit configured to detect a value of voltage of a power supply connected to an input terminal of the power converter, wherein
in accordance with a result of detection performed by the voltage detecting unit, a difference between the different timings at which the plurality of switching devices perform the switching operations is variable.

16. A power converter comprising:
a capacitor;
an N-phase bridge, N being positive integer, that includes N arms each including a switching device connected to the capacitor in parallel; and
a controller configured to control, based on pulse width modulation using a carrier signal, a switching device included in a corresponding arm to perform switching operations, the carrier signal repeating gradually transitioning from a first level to a second level and then resetting to the first level from the second level, wherein
the N arms are connected with one another in parallel,
each arm forms a closed circuit together with the capacitor, and
the controller controls, for arms corresponding with at least two closed circuits, the plurality of switching devices included therein to perform the switching operations performed in accordance with reset of the carrier signal at different timings such that the at least two closed circuits mutually cancel ringing voltages occurring therein, each ringing voltage occurring due to the switching operations performed in accordance with reset of the carrier signal and having a frequency defined by an inductance of a corresponding closed circuit and an output capacity of a switching device included in an arm of the corresponding closed circuit.

17. The power converter of claim 16, wherein
the controller controls the plurality of switching, devices included in the arms corresponding with the at least two closed circuits to perform the switching operations performed in accordance with reset of the carrier signal at the different timing differing from each other by approximately a half of a cycle of each ringing voltage.

18. The power converter of claim 16, wherein
the N arms forming the closed circuits include a U-phase arm, a V-phase arm and a W-phase arm, and
the controller
controls a switching device of the V-phase arm so as to perform the switching operations performed in accordance with reset of the carrier signal later than the switching operations performed by a switching device of the U-phase arm by approximately ⅓ of a cycle of each ringing voltage, and
controls a switching device of the W-phase arm so as to perform the switching operations performed in accordance with reset of the carrier signal later than the switching operations performed by the switching device of the U-phase arm by approximately ⅔ of the cycle of each ringing voltage.

19. The power converter of claim 16, wherein
the controller includes:
a carrier signal generating unit configured to generate the carrier signal;
a control instruction signal generating unit configured to generate control instruction signals; and
a pulse width modulation signal generating unit configured to generate a pulse width modulation signal based on comparisons of the carrier signal with the control instruction signals, each pulse width modulation signal being for controlling a timing at which a. switching device included in. a corresponding arm performs the switching operations; and
a phase shifting unit configured to perform phase shifting on the pulse width modulation signals to generate pulse width modulation signals corresponding one-to-one with the N arms such that the plurality of switching devices included in the arms corresponding with the at least two closed circuits perform the switching operations performed in accordance with reset of the carrier signal at the different timings.

20. The power converter of claim 19, wherein
the phase shifting unit is composed of a field programmable gate array, and
each switching device is composed of a wide bandgap semiconductor.

21. The power converter of claim 16, wherein
the controller includes:
a carrier signal generating unit configured to perform phase shifting on a carrier signal to generate carrier signals corresponding one-to-one with the N arms such that the plurality of switching devices included in the arms corresponding with the at least two closed circuits perform the switching operations performed in accordance with reset of the carrier signals at the different timings;
a control instruction signal generating unit configured to generate control instruction signals; and
a pulse width modulation signal generating unit configured to generate pulse width modulation signals corresponding one-to-one with the N arms based on comparisons of the carrier signals with the control instruction signals, each pulse width modulation signal being for controlling a timing at which a switching device included in a corresponding arm performs the switching operations.

22. The power converter of claim 16, wherein
the inductance of the corresponding dosed circuit includes:
a first inductance, Lm, of a first wire included in a switching device of an arm corresponding with each closed circuit;
a second inductance, Lcap, of the capacitor; and
a third inductance, Lw, of a second wire connecting the switching device of the arm corresponding with each closed circuit and the capacitor, and
a frequency, $f_r$, of a ringing voltage occurring at the corresponding closed, circuit is defined $$f_r = \frac{1}{2\pi\sqrt{(Lcap + Lw + Lm) \times (Coss)}}$$

based on an output capacity, Coss, of a switching device constituting one of the N arms, the Lm, the Lcap, and the Lw.

23. The power converter of claim 22, wherein
an inverse of the frequency, $1/f_r$, a period of a cycle of the ringing voltage, and
the controller controls the plurality of switching, devices included in the arms corresponding with the at least two closed circuits to perform the switching operations performed in accordance with reset of the carrier signal at the different timings differing from each other h approximately a half of the cycle of each ringing voltage.

24. The power converter of claim 22, wherein
the N arms forming the closed circuits include a U-phase arm, a V-phase arm and a w-phase arm,
an inverse of the frequency, $1/f_r$, is a period of a cycle of the ringing voltage, and
the controller
controls a switching device of the V-phase arm to perform the switching operations performed in accordance With reset of the carrier signal later than the switching operations performed by a switching device of the U-phase arm by approximately ⅓ of the cycle of the ringing voltage, and controls a switching device of the W-phase arm to perform the switching operations performed in accordance with reset of the carrier signal later than the switching operations performed by the switching device of the U-phase arm by approximately ⅔ of the cycle of each ringing voltage.

25. The power converter of claim 16, further comprising:
a noise detecting unit configured to detect noise based on each ringing voltage, wherein
in accordance with a result of detection performed by the noise detecting unit, a difference between the different timings at which the plurality of switching devices perform the switching operations is variable.

26. The power converter of claim 25, wherein
the noise detecting unit detects the noise at an input terminal of the power converter.

27. The power converter of claim 25, wherein
the noise detecting unit detects the noise at an output terminal of the power converter.

28. The power converter of claim 16, wherein
each switching device transitions from an ON state to an OFF state in a first period that is the same as a second period during which each switching device transitions from the OFF state to the ON state.

29. The power converter of claim 16, wherein
each switching device is composed of a wide bandgap semiconductor.

30. The power converter of claim 16, further comprising:
as voltage detecting unit configured to detect a value of voltage of a power supply connected to an input terminal of the power converter, wherein
in accordance with a result of detection performed by the voltage detecting unit, a difference between the different timings at which the plurality of switching devices perform the switching operations is variable.

* * * * *